(12) United States Patent
Ikenaga

(10) Patent No.: US 10,218,355 B2
(45) Date of Patent: Feb. 26, 2019

(54) POWER SUPPLY CIRCUIT AND CONTROL METHOD THEREOF

(71) Applicant: Renesas Electronics Corporation, Kawasaki-shi, Kanagawa (JP)

(72) Inventor: Yoshifumi Ikenaga, Kanagawa (JP)

(73) Assignee: Renesas Electronics Corporation, Tokyo ( * ) Notice: Subject to any disclaimer, the term of this patent is extended or adjusted under 35 U.S.C. 154(b) by 1208 days.

(21) Appl. No.: 14/479,339

(22) Filed: Sep. 7, 2014

(65) Prior Publication Data

US 2015/0091382 A1  Apr. 2, 2015

(30) Foreign Application Priority Data

Sep. 27, 2013  (JP) ................ 2013-202030
May 14, 2014  (JP) ................ 2014-100133

(51) Int. Cl.
*H02J 4/00* (2006.01)
*H03K 17/693* (2006.01)
*H02J 1/10* (2006.01)
*H02M 3/158* (2006.01)

(52) U.S. Cl.
CPC .......... *H03K 17/693* (2013.01); *H02J 1/10* (2013.01); *H02M 3/1584* (2013.01); *Y10T 307/549* (2015.04)

(58) Field of Classification Search
CPC ...... H02J 1/10; H03K 17/693; H02M 3/1584; Y10T 307/549
See application file for complete search history.

(56) References Cited

U.S. PATENT DOCUMENTS

| 5,814,972 | A | 9/1998 | Shimada et al. |
| 6,262,494 | B1 | 7/2001 | Tsukuni et al. |
| 8,716,891 | B2 * | 5/2014 | Choi ............... H02J 3/32 307/71 |
| 9,608,438 | B2 * | 3/2017 | Chu ............... H02J 1/00 |

(Continued)

FOREIGN PATENT DOCUMENTS

| JP | 11-273747 A | 10/1999 |
| JP | 2959657 B2 | 10/1999 |
| JP | 2010-267106 A | 11/2010 |

OTHER PUBLICATIONS

Office Action dated Aug. 15, 2017, in Japanese Patent Application No. 2014-100133.

(Continued)

*Primary Examiner* — Rexford Barnie
*Assistant Examiner* — Elim Ortiz
(74) *Attorney, Agent, or Firm* — Shapiro, Gabor and Rosenberger, PLLC

(57) ABSTRACT

A power supply circuit according to an embodiment of the invention includes: voltage sources; voltage control circuits that boost an input voltage; and a voltage source connection switch that connects at least one of the voltage sources to one of the voltage control circuits. For example, the voltage source connection switch connects, to the voltage control circuit, a voltage source having a voltage lower than a predetermined reference voltage among the voltage sources, and connects, to the voltage control circuit, a voltage source having a voltage equal to or higher than the determined reference voltage among the voltage sources.

19 Claims, 21 Drawing Sheets

(56) References Cited

U.S. PATENT DOCUMENTS

| | | | |
|---|---|---|---|
| 2005/0035811 A1* | 2/2005 | Shin | H02M 3/073 327/536 |
| 2007/0165432 A1* | 7/2007 | Okamura | H02M 5/4585 363/132 |
| 2015/0002095 A1* | 1/2015 | Wada | H02J 7/0021 320/112 |

OTHER PUBLICATIONS

Office Action dated Feb. 7, 2018, in Chinese Patent Application No. 201410474525.9.

\* cited by examiner

POWER SUPPLY CIRCUIT AND CONTROL METHOD THEREOF

CROSS-REFERENCE TO RELATED APPLICATIONS

This application is based upon and claims the benefit of priority from Japanese patent applications No. 2013-202030, filed on Sep. 27, 2013 and No. 2014-100133, filed on May 14, 2014, the disclosure of which are incorporated herein in its entirety by reference.

BACKGROUND

The present invention relates to a power supply circuit and a control method thereof, and more particularly, to a power supply circuit including, for example, a plurality of voltage sources, and a control method thereof.

In recent years, an energy harvesting technique that converts ambient energy, such as light energy, vibration energy, thermal energy, and radio waves (electromagnetic waves), into power has been attracting more attention. The use of the energy harvesting technique eliminates the need to mount batteries in electronic devices, and enhances the user-friendliness of electronic devices.

Japanese Unexamined Patent Application Publication No. H11-273747 discloses a technique relating to a battery pack which enables checking of the individual state of a plurality of batteries. Japanese Patent No. 2959657 discloses a technique relating to an electronic device which enables a higher degree of freedom of a plurality of batteries to accomplish improved operating efficiency of the batteries.

SUMMARY

When the energy harvesting technique is used, the voltage obtained by a single voltage source is extremely small. Accordingly, a voltage control circuit (booster circuit) is required to boost the voltage of the voltage source to a voltage at which the electronic device can be driven. Further, since the power obtained by a single voltage source using the energy harvesting technique is small, it is necessary to provide a plurality of voltage sources to drive the electronic device and aggregate power obtained by the voltage sources.

However, if the plurality of voltage sources are respectively provided with voltage control circuits, the circuit area of the power supply circuit increases. On the other hand, if a single voltage control circuit is shared by the plurality of voltage sources in order to reduce the circuit area, the output voltages of the voltage sources are not constant, and thus a power loss occurs, which causes a problem that power cannot be effectively extracted from the voltage sources.

Other problems to be solved and novel features of the present invention will become apparent from the following description and the accompanying drawings.

A first aspect of the present invention is a power supply circuit including: N (N≥3) voltage sources; first and second voltage control circuits that boost an input voltage; and a voltage source connection switch that connects at least one of the N voltage sources to one of the first and second voltage control circuits.

In the power supply circuit according to the first aspect, the first and second voltage control circuits and the voltage source connection switch are formed on a chip. The first voltage control circuit and the voltage source connection switch are connected to each other via a first wire formed outside the chip. The second voltage control circuit and the voltage source connection switch are connected to each other via a second wire formed outside the chip.

A second aspect of the present invention is a method for controlling a power supply circuit, including: monitoring a voltage of each of N voltage sources; and connecting at least one of the N voltage sources to one of first and second voltage control circuits according to a voltage of each of the N voltage sources.

According to the above aspects, it is possible to provide a power supply circuit capable of effectively extracting power from each voltage source, and a control method thereof.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

A first embodiment will be described below with reference to the drawings.

Figure 1:
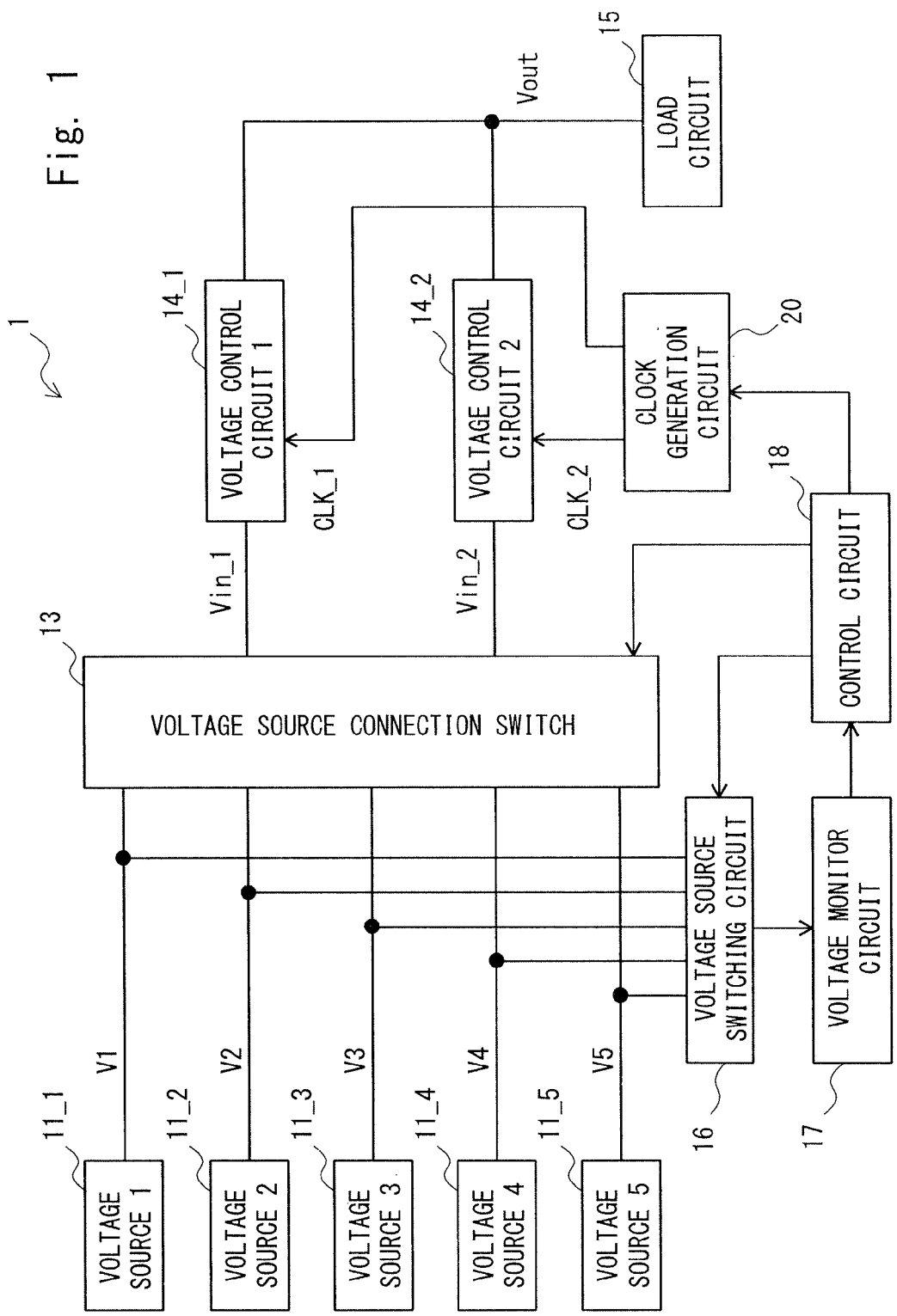
FIG. 1 is a block diagram showing a power supply circuit according to a first embodiment.

FIG. 1 is a block diagram showing a power supply circuit 1 according to the first embodiment. As shown in FIG. 1, the power supply circuit 1 according to the first embodiment includes voltage sources 11_1 to 11_5, a voltage source connection switch 13, voltage control circuits 14_1 and 14_2, a voltage source switching circuit 16, a voltage monitor circuit 17, a control circuit 18, and a clock generation circuit 20. The power supply circuit 1 supplies power to a load circuit 15.

The voltage sources 11_1 to 11_5 generate power supply voltages V1 to V5, respectively, and output the generated power supply voltages V1 to V5 to each of the voltage source connection switch 13 and the voltage source switching circuit 16. The voltage sources 11_1 to 11_5 each generate a power supply voltage (power) by using an energy harvesting technique. For example, the voltage sources 11_1 to 11_5 each convert ambient energy, such as light, vibration energy, thermal energy, and radio waves (electromagnetic waves), into power.

For example, in the case of converting light energy into power, a photoelectric conversion element (solar battery) can be used. In the case of converting vibration energy into power, a piezoelectric element can be used. In the case of converting thermal energy into power, a thermoelectric element (Peltier element) can be used. In the case of converting radio waves into power, a circuit (rectenna) including an antenna and a rectifying element, for example, can be used. When the energy harvesting technique is used, the voltage obtained by a single voltage source is extremely small. For example, a power supply voltage of about 0.1 V to 0.2 V is obtained when radio waves are converted into power.

In the case of converting radio waves into power, in order to convert radio waves in a plurality of frequency bands, the voltage sources 11_1 to 11_5 corresponding to the respective frequency bands (i.e., the voltage sources 11_1 to 11_5 which receive the radio waves in the respective frequency bands) may be provided. The term "predetermined frequency band" described herein refers to a frequency band in which many types of radio waves are used (i.e., a high-energy frequency band), such as a frequency band for cellular phones, a frequency band for wireless LAN, or a frequency band for digital terrestrial broadcasting. Thus, when the radio waves in different frequency bands are used, the power supply voltages obtained by the voltage sources 11_1 to 11_5 may vary depending on the frequency band.

The voltage source connection switch 13 switches connection states between each of the voltage sources 11_1 to 11_5 and each of the voltage control circuits 14_1 and 14_2. Specifically, the voltage source connection switch 13 switches three connection states, i.e., a state in which the voltage source 11_n (1≤n≤5) is connected to the voltage control circuit 14_1, a state in which the voltage source 11_n is connected to the voltage control circuit 14_2, and a state in which the voltage source 11_n is disconnected from both the voltage control circuits 14_1 and 14_2.

Figure 2:
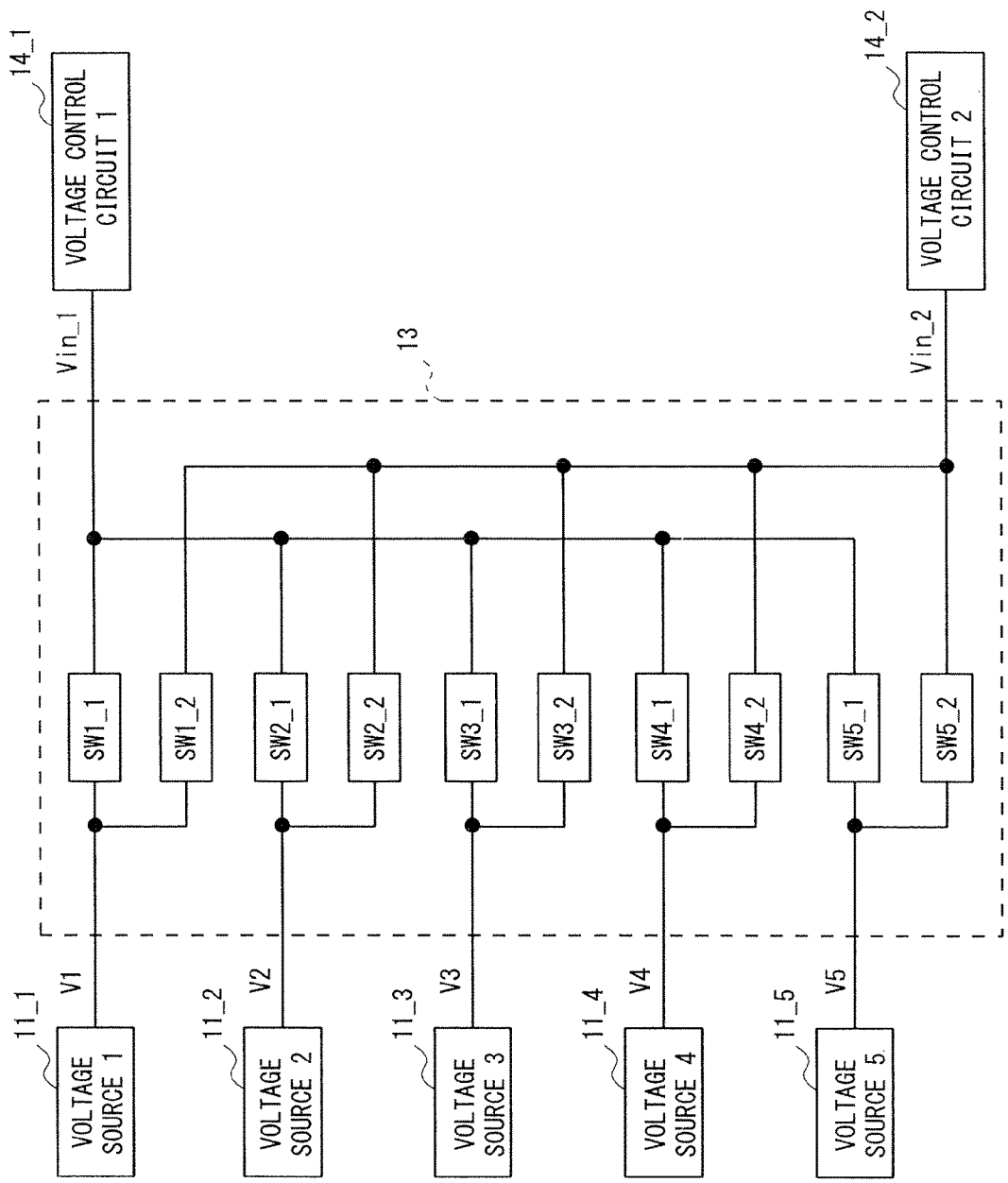
FIG. 2 is a block diagram showing an example of a voltage source connection switch including the power supply circuit according to the first embodiment.

FIG. 2 is a block diagram showing an example of the voltage source connection switch 13 included in the power supply circuit 1 according to the first embodiment. As shown in FIG. 2, the voltage source connection switch 13 includes a plurality of switches SW1_1 to SW5_1 and SW1_2 to SW5_2. The voltage source 11_1 is connected to the voltage control circuit 14_1 via the switch SW1_1, and is connected to the voltage control circuit 14_2 via the switch SW1_2. The voltage source 11_2 is connected to the voltage control circuit 14_1 via the switch SW2_1, and is connected to the voltage control circuit 14_2 via the switch SW2_2. The voltage sources 11_3 to 11_5 have a configuration similar to that of.

For example, the voltage source connection switch 13 turns on the switch SW1_1 and turns off the switch SW1_2, thereby allowing the voltage source 11_1 to be connected to the voltage control circuit 14_1. The voltage source connection switch 13 turns off the switch SW1_1 and turns on the switch SW1_2, thereby allowing the voltage source 11_1 to be connected to the voltage control circuit 14_2. The voltage source connection switch 13 turns off both the switch SW1_1 and the switch SW1_2, thereby bringing the voltage source 11_1 into the state of being disconnected from both the voltage control circuits 14_1 and 14_2. The voltage sources 11_2 to 11_5 have a configuration similar to that of the voltage source 11_1. The plurality of switches SW1_1 to SW5_1 and SW1_2 to SW5_2 are controlled by control signals output from the control circuit 18.

Figure 3:
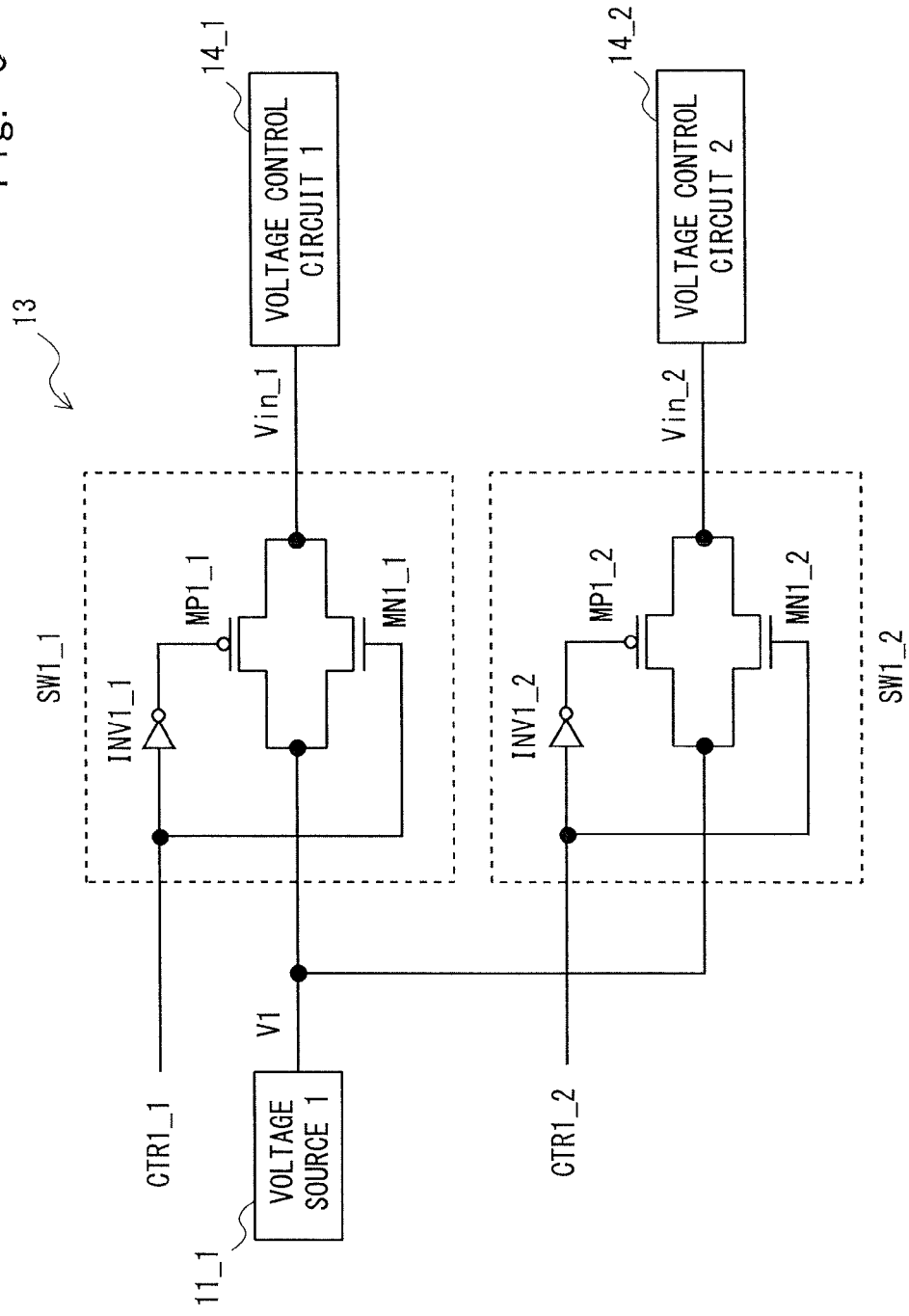
FIG. 3 is a circuit diagram showing a specific example of the voltage source connection switch.

FIG. 3 is a circuit diagram showing a specific example of the voltage source connection switch 13. As shown in FIG. 3, for example, the switch SW1_1 can be configured using a PMOS transistor MP1_1, an NMOS transistor MN1_1, and an inverter INV1_1. The voltage source 11_1 is connected to the source of the PMOS transistor MP1_1 and the drain of the NMOS transistor MN1_1. The voltage control circuit 14_1 is connected to the drain of the PMOS transistor MP1_1 and the source of the NMOS transistor MN1_1. The gate of the NMOS transistor MN1_1 is connected to the input side of the inverter INV1_1, and the gate of the PMOS transistor MP1_1 is connected to the output side of the inverter INV1_1.

When the control signal CTR1_1 is at high level, the gate of the NMOS transistor MN1_1 is supplied with a high-level signal, and the gate of the PMOS transistor MP1_1 is supplied with a low-level signal. Accordingly, in this case, the NMOS transistor MN1_1 and the PMOS transistor MP1_1 are turned on and the voltage source 11_1 and the voltage control circuit 14_1 are connected to each other. In other words, the voltage control circuit 14_1 is supplied with a power supply voltage V1. The switch SW1_2 has a configuration similar to that of the switch SW1_1.

The configuration examples of the switches SW1_1 and SW1_2 shown in FIG. 3 are illustrated by way of example only, and the switches SW1_1 and SW1_2 may have other configurations. For example, the switch SW1_1 may be configured using only PMOS transistors, or may be configured using only NMOS transistors. Considering that the power supply voltage V1 supplied from the voltage source 11_1 is low, it is preferable to use an NMOS transistor when the switch SW1_1 is configured using a single MOS transistor.

For example, the voltage source connection switch 13 may connect, to the voltage control circuit 14_1, voltage sources each having a voltage lower than a predetermined reference voltage among the voltage sources 11_1 to 11_5, and the voltage source connection switch 13 may connect, to the voltage control circuit 14_2, voltage sources each having a voltage equal to or higher than the predetermined reference voltage among the voltage sources 11_1 to 11_5. This configuration makes it possible to connect the voltage sources each having power supply voltages of about the same level to the voltage control circuits 14_1 and 14_2, respectively.

The voltage control circuits 14_1 and 14_2 shown in FIG. 1 boost input voltages Vin_1 and Vin_2, respectively, and output a boosted output voltage Vout to the load circuit 15. The output voltage output from the voltage control circuit 14_1 and the output voltage output from the voltage control circuit 14_2 are substantially the same (Vout). The voltage control circuit 14_1 boosts the input voltage according to a clock signal CLK_1 which is supplied from the clock generation circuit 20. The voltage control circuit 14_2 boosts the input voltage according to a clock signal CLK_2 which is supplied from the clock generation circuit 20. The clock generation circuit 20 generates the clock signals CLK_1 and CLK_2 according to the control signal supplied from the control circuit 18. The voltage control circuits 14_1 and 14_2 are respectively supplied with the clock signals CLK_1 and CLK_2 that are set in such a manner that the output voltage of the voltage control circuit 14_1 and the output voltage of the voltage control circuit 14_2 are substantially the same.

For example, the voltage control circuit 14_1 boosts the input voltage according to a duty ratio of the clock signal CLK_1 supplied to the voltage control circuit 14_1. Similarly, the voltage control circuit 14_2 boosts the input voltage according to a duty ratio of the clock signal CLK_2 supplied to the voltage control circuit 14_2.

Figure 4:
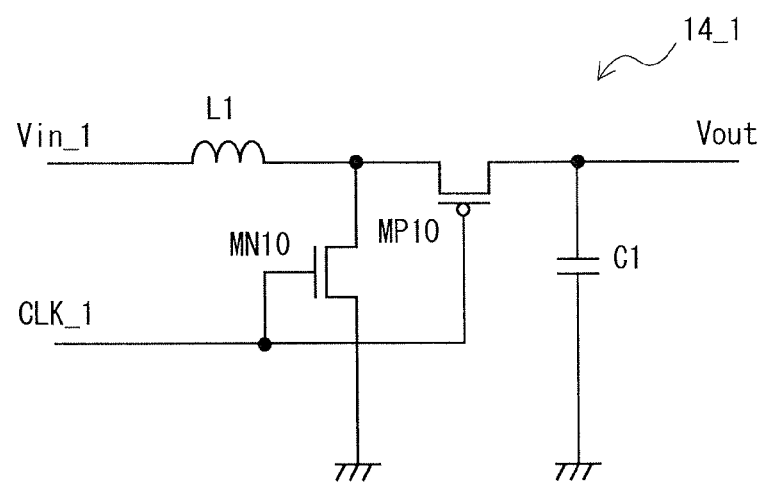
FIG. 4 is a circuit diagram showing an example of a voltage control circuit included in the power supply circuit according to the first embodiment.

FIG. 4 is a circuit diagram showing an example of the voltage control circuit 14_1 (the voltage control circuit 14_2 also has the same configuration). As shown in FIG. 4, the voltage control circuit 14_1 can be configured using a switching regulator including an inductor L1, a PMOS transistor MP10, an NMOS transistor MN10, and a capacitor C1.

One end of the inductor L1 is supplied with the input voltage Vin_1 which is supplied from the voltage source. The drain of the NMOS transistor MN10 is connected to the other end of the inductor L1 and the source of the PMOS transistor MP10. The source of the NMOS transistor MN10 is grounded. The gate of the NMOS transistor MN10 is supplied with the clock signal CLK_1. The source of the PMOS transistor MP10 is connected to the other end of the inductor L1 and the drain of the NMOS transistor MN10. The drain of the PMOS transistor MP10 is connected to one end of the capacitor C1. The gate of the PMOS transistor MP10 is supplied with the clock signal CLK_1. The output voltage Vout is output from the drain of the PMOS transistor MP10.

When the clock signal CLK_1 is at high level, the NMOS transistor MN10 is in the ON state and the PMOS transistor MP10 is in the OFF state. At this time, one end of the inductor L1 is supplied with the input voltage Vin_1 and the other end of the inductor L1 is grounded, so that a current flows through the inductor L1. As a result, energy is stored in the inductor L1. After that, when the clock signal CLK_1 becomes the low level, the NMOS transistor MN10 is turned off and the PMOS transistor MP10 is turned on. This causes the energy stored in the inductor L1 to be discharged from the drain of the PMOS transistor MP10, so that the output voltage Vout is output. The output voltage Vout is determined according to the duty ratio of the clock signal CLK_1. In this case, the duty ratio of the clock signal CLK_1 can be calculated as follows: (high-level period)/(high-level period+low-level period).

The output voltage Vout of the voltage control circuit 14_1 increases as the duty ratio of the clock signal CLK_1 increases. In the power supply circuit according to the first embodiment, the output voltage Vout of the voltage control circuit 14_1 and the output voltage Vout of the voltage control circuit 14_2 are the same. Accordingly, for example, when the input voltage Vin_1 supplied to the voltage control circuit 14_1 is lower than the input voltage Vin_2 supplied to the voltage control circuit 14_2, the duty ratio of the clock signal CLK_1 is larger than the duty ratio of the clock signal CLK_2.

The voltage source switching circuit 16 shown in FIG. 1 sequentially switches connections between each of the voltage sources 11_1 to 11_5 and the voltage monitor circuit 17. In other words, the voltage source switching circuit 16 outputs the power supply voltage of any one of the voltage sources 11_1 to 11_5 to the voltage monitor circuit 17.

Figure 5:
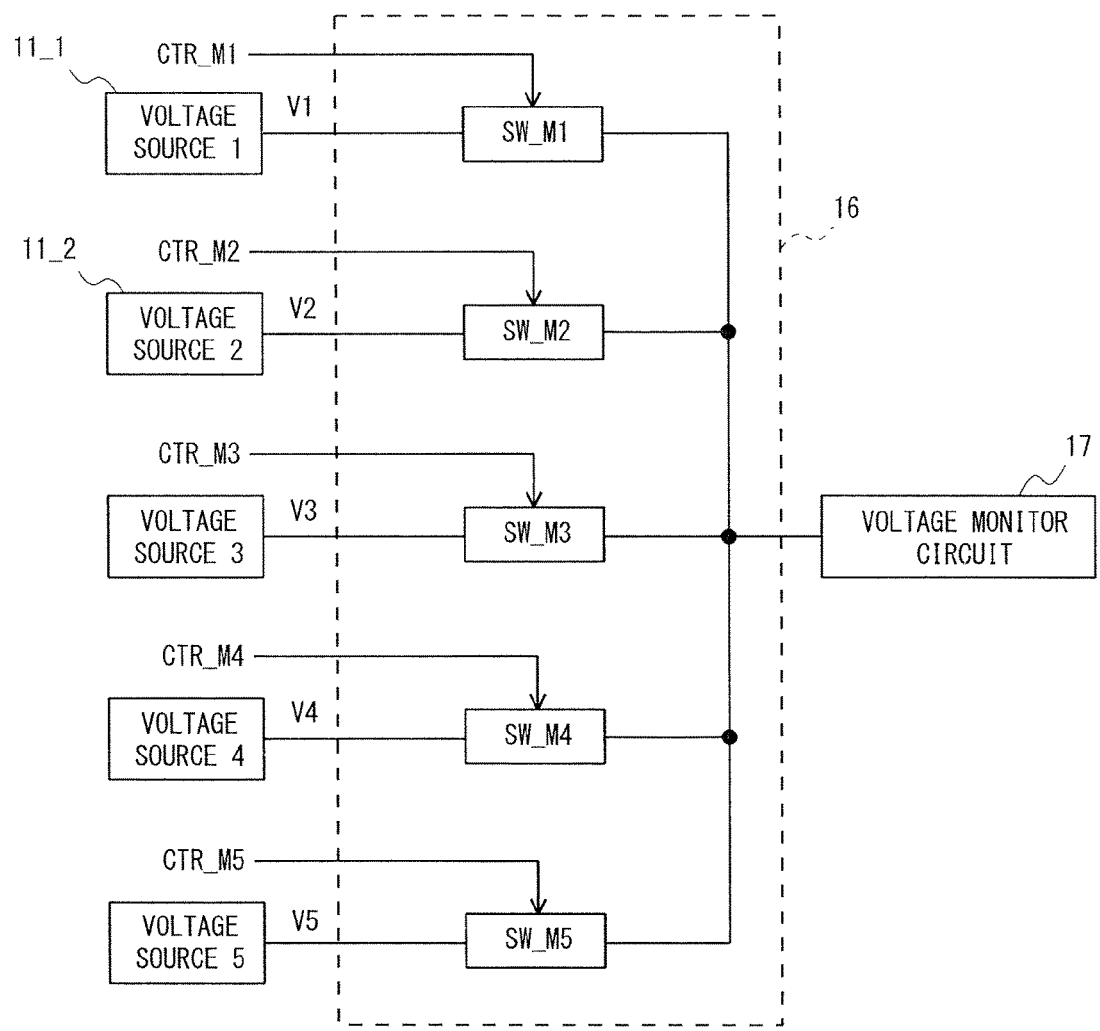
FIG. 5 is a block diagram showing an example of a voltage source switching circuit included in the power supply circuit according to the first embodiment.

FIG. 5 is a block diagram showing an example of the voltage source switching circuit 16. As shown in FIG. 5, the voltage source switching circuit 16 includes a plurality of switches SW_M1 to SW_M5. The voltage source 11_1 is connected to the voltage monitor circuit 17 via the switch SW_M1. The voltage source 11_2 is connected to the voltage monitor circuit 17 via the switch SW_M2. The voltage source 11_3 is connected to the voltage monitor circuit 17 via the switch SW_M3. The voltage source 11_4 is connected to the voltage monitor circuit 17 via the switch SW_M4. The voltage source 11_5 is connected to the voltage monitor circuit 17 via the switch SW_M5.

By turning on anyone of the switches SW_M1 to SW_M5, the power supply voltage of any one of the voltage sources 11_1 to 11_5 can be output to the voltage monitor circuit 17. The switches SW_M1 to SW_M5 are controlled by using control signals CTR_M1 to CTR_M5, respectively, which are output from the control circuit. When the power supply voltages of the voltage sources 11_1 to 11_5 are not monitored, all the switches SW_M1 to SW_M5 are in the OFF state.

Figure 6:
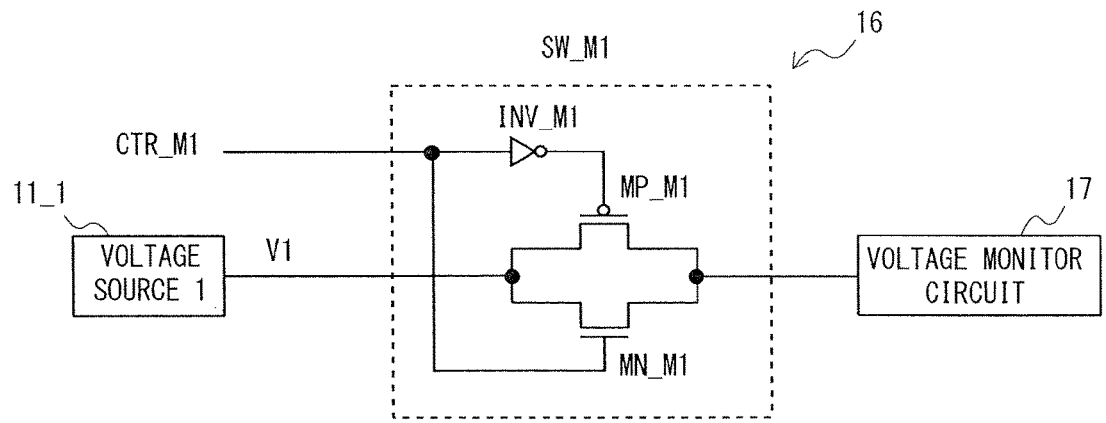
FIG. 6 is a circuit diagram showing a specific example of the voltage source switching circuit.

FIG. 6 is a circuit diagram showing a specific example of the switches SW_M1 to SW_M5 included in the voltage source switching circuit 16. Although only the switch SW_M1 is illustrated in FIG. 6, the other switches SW_M2 to SW_M5 also have the same configuration. As shown in FIG. 6, the switch SW_M1 can be configured using, for example, a PMOS transistor MP_M1, an NMOS transistor MN_M1, and an inverter INV1_M1. The voltage source 11_1 is connected to the source of the PMOS transistor MP_M1 and the drain of the NMOS transistor MN_M1. The voltage monitor circuit 17 is connected to the drain of the PMOS transistor MP_M1 and the source of the NMOS transistor MN_M1. The gate of the NMOS transistor MN_M1 is connected to the input side of the inverter INV1_M1, and the gate of the PMOS transistor MP_M1 is connected to the output side of the inverter INV1_M1.

When the control signal CTR_M1 is at high level, the gate of the NMOS transistor MN_M1 is supplied with a high-level signal, and the gate of the PMOS transistor MP_M1 is supplied with a low-level signal. Accordingly, in this case, the NMOS transistor MN_M1 and the PMOS transistor MP_M1 are turned on, and the voltage source 11_1 and the voltage monitor circuit 17 are connected to each other. In other words, the voltage monitor circuit 17 is supplied with the power supply voltage V1.

The voltage monitor circuit 17 monitors the power supply voltages V1 to V5 of the voltage sources 11_1 to 11_5. Specifically, the voltage monitor circuit 17 monitors the power supply voltage of any one of the voltage sources 11_1 to 11_5 which is selected in the voltage source switching circuit 16.

Figure 7:
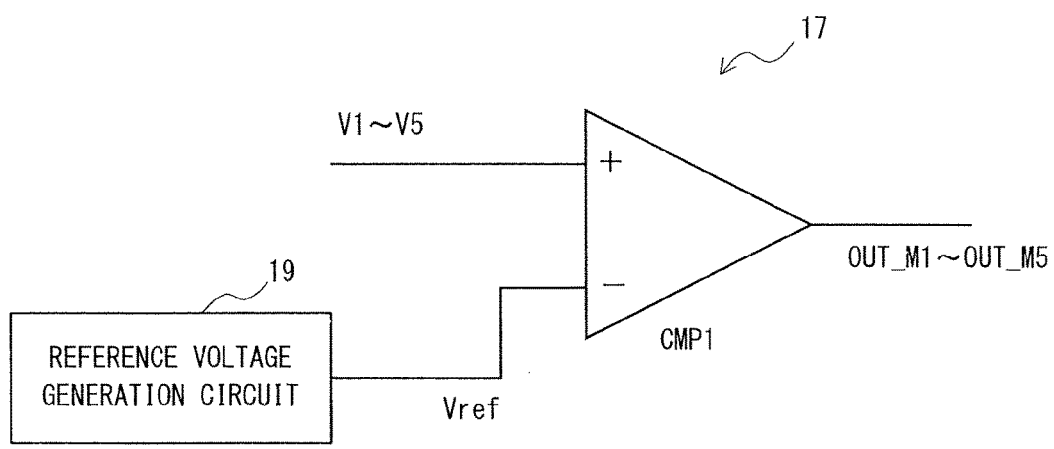
FIG. 7 is a diagram showing an example of a voltage monitor circuit included in the power supply circuit according to the first embodiment.

FIG. 7 is a block diagram showing an example of the voltage monitor circuit 17. As shown in FIG. 7, the voltage monitor circuit 17 includes a reference voltage generation circuit 19 and a comparator CMP1. The reference voltage generation circuit 19 generates a reference voltage Vref. The reference voltage generation circuit 19 can be configured using, for example, a bandgap reference circuit. The comparator CMP1 compares the power supply voltages V1 to V5 of the voltage sources 11_1 to 11_5 with the reference voltage Vref, and outputs comparison results OUT_M1 to OUT_M5.

For example, when the power supply voltage V1 of the voltage source 11_1 is lower than the reference voltage Vref, the comparator CMP1 outputs a low-level signal as the comparison result OUT_M1. On the other hand, when the power supply voltage V1 of the voltage source 11_1 is equal to or higher than the reference voltage Vref, the comparator CMP1 outputs a high-level signal as the comparison result OUT_M1.

The comparison results OUT_M1 to OUT_M5 (i.e., the results of the comparison between the power supply voltages V1 to V5 of the voltage sources 11_1 to 11_5 and the reference voltage Vref) of the voltage monitor circuit 17 are stored in the control circuit 18. The control circuit 18 includes, for example, flip-flops FF1 to FF5 (not shown) respectively corresponding to the voltage sources 11_1 to 11_5, and the comparison results OUT_M1 to OUT_M5 between the power supply voltages V1 to V5 of the voltage sources 11_1 to 11_5 and the reference voltage Vref are stored in the flip-flops FF1 to FF5, respectively.

The reference voltage Vref may be determined based on the input voltage Vin_1 of the voltage control circuit 14_1 and the input voltage Vin_2 of the voltage control circuit 14_2. For example, when Vin_1<Vin_2, the reference voltage Vref may be determined so as to satisfy Vin_1×2<Vref<Vin_2×2.

Alternatively, the reference voltage Vref may be determined based on the power supply voltages V1 to V5 of the voltage sources 11_1 to 11_5. For example, when a maximum value of the power supply voltages V1 to V5 is represented by V_max and a minimum value of the power supply voltages V1 to V5 is represented by V_min, the reference voltage Vref may be determined so as to satisfy V_min<Vref<V_max. More alternatively, the reference voltage Vref may be determined using an average value of the power supply voltages V1 to V5 (or values which are approximate to the average value).

The control circuit 18 controls the power supply circuit 1. Specifically, the control circuit 18 controls the switches SW_M1 to SW_M5 which are included in the voltage source switching circuit 16. The control circuit 18 controls the plurality of switches SW1_1 to SW5_1 and SW1_2 to SW5_2, which are included in the voltage source connection switch 13, according to the comparison results OUT_M1 to OUT_M5 of the voltage monitor circuit 17. For example, the control circuit 18 connects, to the voltage control circuit 14_1, voltage sources each having a voltage lower than the predetermined reference voltage Vref among the voltage sources 11_1 to 11_5, and the control circuit 18 connects, to the voltage control circuit 14_2, voltage sources each having a voltage equal to or higher than the predetermined reference voltage Vref among the voltage sources 11_1 to 11_5. This configuration allows the voltage sources each having substantially the same power supply voltage to be connected to the voltage control circuits 14_1 and 14_2, respectively. The control circuit 18 also controls the clock generation circuit 20. For example, the control circuit 18 controls the duty ratio of each of the clock signals CLK_1 and CLK_2 generated by the clock generation circuit 20, thereby making it possible to adjust the output voltage of each of the voltage control circuits 14_1 and 14_2.

Next, the operation of the power supply circuit according to the first embodiment will be described with reference to a timing diagram of FIG. 8. The power supply circuit 1 according to the first embodiment has operating modes including a monitor mode and a normal mode. The normal mode is a mode in which the voltage source connection switch 13 connects at least one of the voltage sources 11_1 to 11_5 to one of the voltage control circuit 14_1 and the voltage control circuit 14_2 to thereby supply power to the load circuit 15. The monitor mode is a mode in which the power supply voltages V1 to V5 of the voltage sources 11_1 to 11_5 are monitored by the voltage monitor circuit 17. In the monitor mode, among the voltage sources 11_1 to 11_5, voltage sources other than the voltage sources whose supply voltage is monitored by the voltage monitor circuit 17 are connected to one of the voltage control circuit 14_1 and the voltage control circuit 14_2, as in the normal mode. Accordingly, also in the monitor mode, the load circuit 15 is supplied with power. The voltage control circuit 14_1 is supplied with the clock signal CLK_1 having a predetermined duty ratio, and the voltage control circuit 14_2 is supplied with the clock signal CLK_2 having a predetermined duty ratio.

Figure 8:
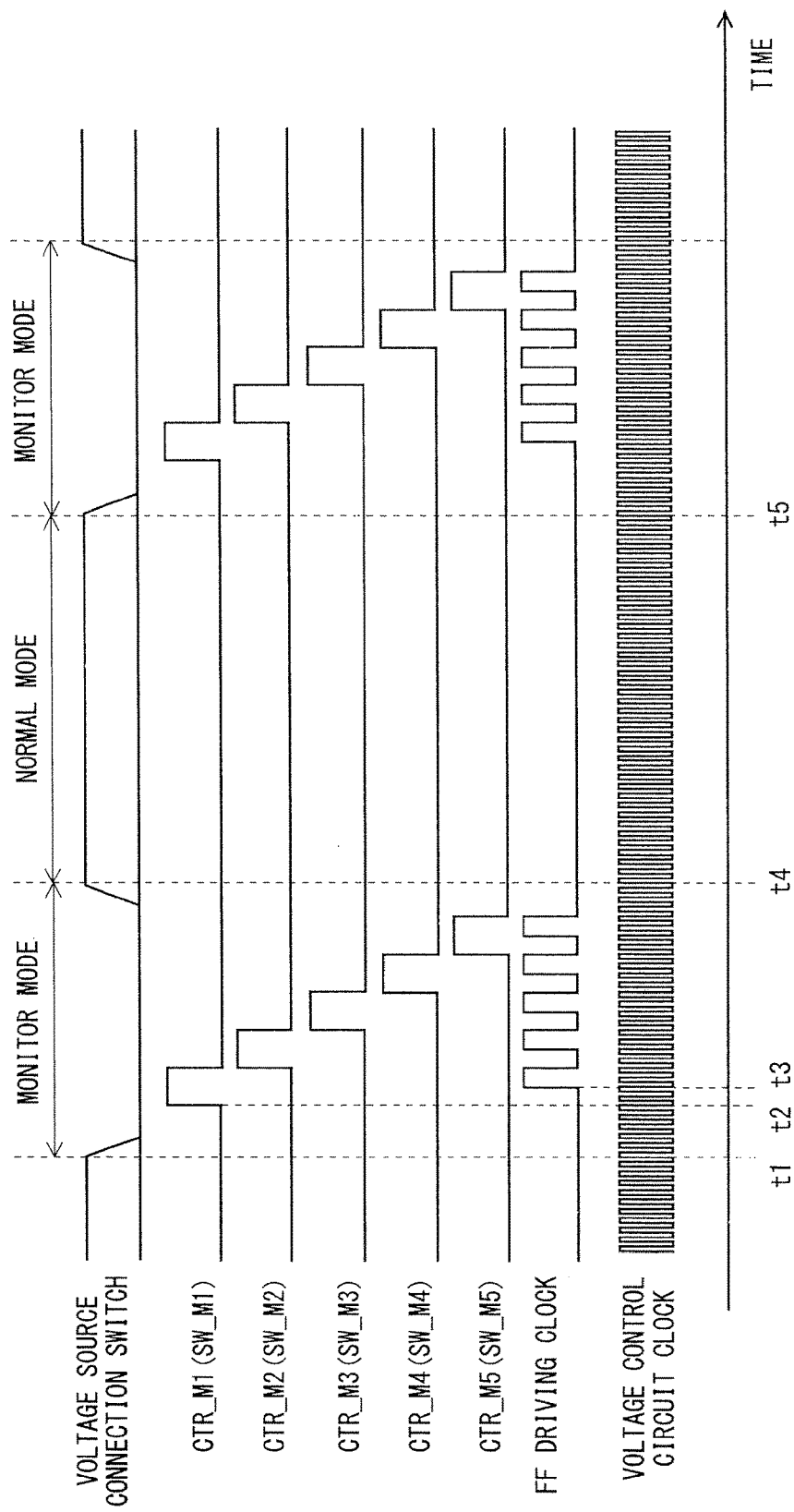
FIG. 8 is a timing diagram showing an operation of the power supply circuit according to the first embodiment.

As shown in FIG. 8, the voltage source connection switch 13 shifts from the normal mode to the monitor mode at timing t1. Next, at timing t2, when the control signal CTR_M1 of the switch SW_M1 (see FIG. 5), which is included in the voltage source switching circuit 16, becomes the high level, the switch SW_M1 is turned on and the power supply voltage V1 of the voltage source 11_1 is output to the voltage monitor circuit 17. At this time, the voltage source connection switch 13 switches the connection state to a state in which the voltage source 11_1 is disconnected from both the voltage control circuits 14_1 and 14_2.

The voltage monitor circuit 17 compares the power supply voltage V1 of the voltage source 11_1 with the reference voltage Vref, and outputs the comparison result OUT_M1. For example, when the power supply voltage V1 of the voltage source 11_1 is lower than the reference voltage Vref, the voltage monitor circuit 17 outputs a low-level signal as the comparison result OUT_M1. On the other hand, when the power supply voltage V1 of the voltage source 11_1 is equal to or higher than the reference voltage Vref, the voltage monitor circuit 17 outputs a high-level signal as the comparison result OUT_M1.

At timing t3, when a driving clock for the flip-flop FF1 that stores the comparison result OUT_M1 becomes the high level, the comparison result OUT_M1 (information on the voltage of the voltage source 11_1) is stored in the flip-flop FF1. After that, the control signals CTR_M2 to CTR_M5 are sequentially brought to the high level, and as in the case of the voltage source 11_1, the power supply voltages V2 to V5 of the voltage sources 11_2 to 11_5 are compared with the reference voltage Vref and the comparison results OUT_M2 to OUT_M5 are respectively stored in the flip-flops FF2 to FF5.

After that, the voltage source connection switch 13 shifts from the monitor mode to the normal mode at timing t4. At this time, the voltage source connection switch 13 connects at least one of the voltage sources 11_1 to 11_5 to one of the voltage control circuits 14_1 and 14_2 according to the comparison results OUT_M1 to OUT_M5 (i.e., information on the voltage of the voltage sources 11_1 to 11_5) which are respectively stored in the flip-flops FF1 to FF5. Thus, the state of the power supply voltage of each of the voltage sources 11_1 to 11_5 monitored in the monitor mode is reflected in the connection state of the voltage source connection switch 13.

For example, the voltage source connection switch 13 connects, to the voltage control circuit 14_1, voltage sources each having a voltage lower than the predetermined reference voltage Vref among the voltage sources 11_1 to 11_5, and connects, to the voltage control circuit 14_2, voltage sources each having a voltage equal to or higher than the predetermined reference voltage Vref among the voltage sources 11_1 to 11_5. This configuration allows the voltage sources each having substantially the same power supply voltage to be connected to the same voltage control circuit.

At this time, a lower-limit reference voltage Vref_L may be provided, and voltage sources each having a power supply voltage lower than the lower-limit reference voltage Vref_L may be configured such that the voltage sources are not connected to either of the voltage control circuits 14_1 and 14_2. Further, an upper-limit reference voltage Vref_H may be provided, and voltage sources each having a power supply voltage higher than the upper-limit reference voltage Vref_H may be configured such that the voltage sources are not connected to either of the voltage control circuits 14_1 and 14_2.

After that, the voltage source connection switch 13 shifts from the normal mode to the monitor mode again at timing t5. Subsequently, the above-described operation is repeated.

As described in the background art, when the energy harvesting technique is used, the voltage obtained by a single voltage source is extremely small. For example, the voltage obtained using radio waves traveling in the atmosphere (environmental radio waves) is about 0.1 to 0.4V, which is extremely small. Accordingly, a voltage control circuit is required to boost the voltage of the voltage source to a voltage at which the electronic device can be driven. In order to drive, for example, a microcomputer, it is necessary to use the voltage control circuit to boost the voltage to about 1V.

Further, since the power obtained by a single voltage source using the energy harvesting technique is small, it is necessary to provide a plurality of voltage sources to drive the electronic device and aggregate power obtained by the voltage sources. Power of about several hundreds of $\mu$W to several mW is required to drive, for example, a microcomputer.

However, if the plurality of voltage sources are respectively provided with voltage control circuits, the circuit area of the power supply circuit increases. On the other hand, if a single voltage control circuit is shared by the plurality of voltage sources in order to reduce the circuit area, the output voltages of the voltage sources are not constant, and thus a power loss occurs, which causes a problem that power cannot be effectively extracted from the voltage sources.

Especially, in the voltage source that generates power using radio waves, a rectifier circuit is used. This may make it difficult to extract power from the voltage source when the generated voltage is low.

Accordingly, in the power supply circuit 1 according to the first embodiment, the plurality of voltage sources 11_1 to 11_5 are provided with the plurality of voltage control circuits 14_1 and 14_2. Further, the voltage source connection switch 13 is used to connect at least one of the voltage sources 11_1 to 11_5 to one of the plurality of voltage control circuits 14_1 and 14_2. For example, voltage sources each having a power supply voltage lower than the reference voltage are connected to the voltage control circuit 14_1, and voltage sources each having a power supply voltage equal to or higher than the reference voltage are connected to the voltage control circuit 14_2. Consequently, it is possible to provide a power supply circuit capable of effectively extracting power from each voltage source, and a control method thereof. Further, since the voltage control circuits are shared by the plurality of voltage sources, the circuit area of the power supply circuit can be reduced.

Figure 9:
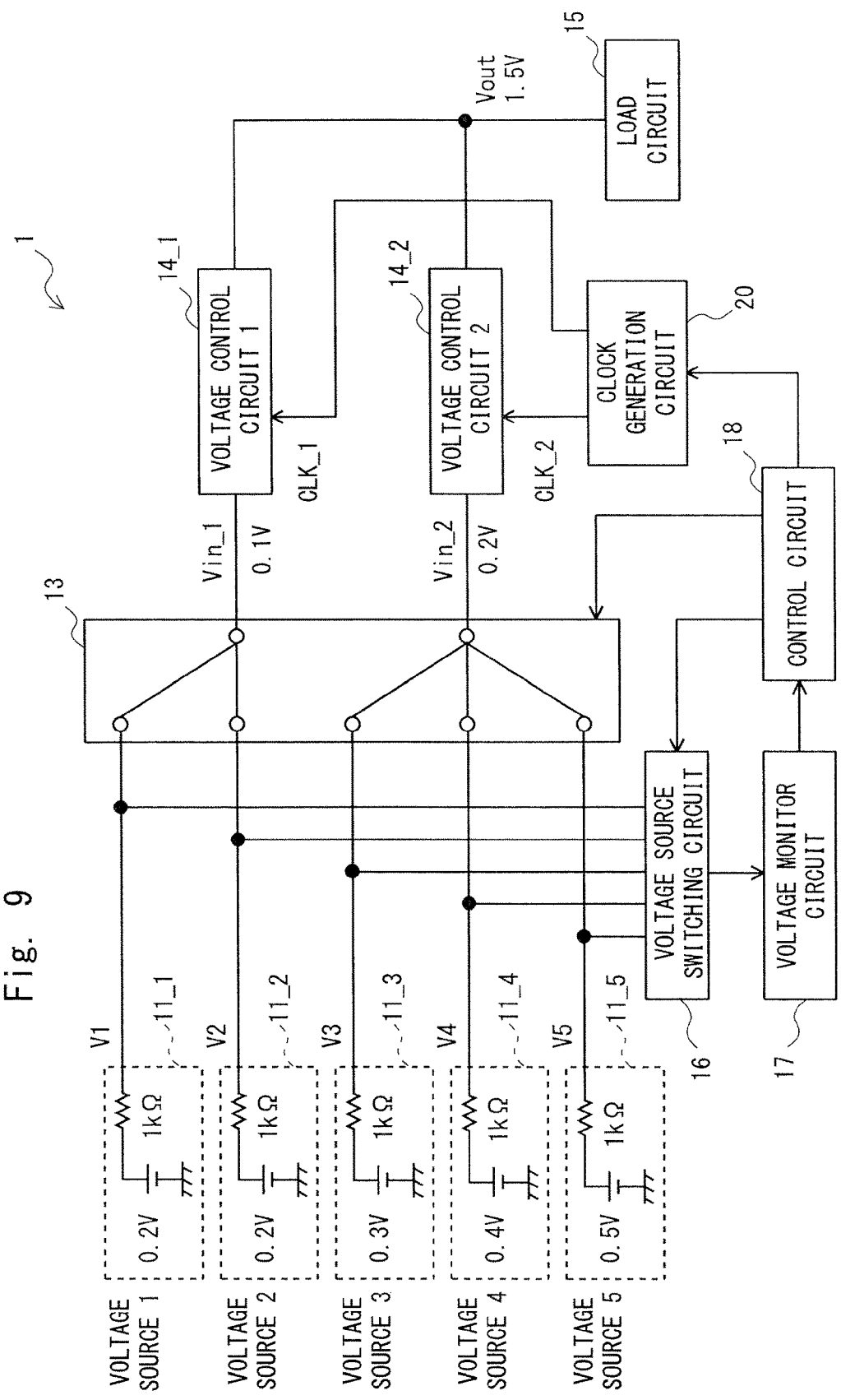
FIG. 9 is a block diagram showing an example of the operation of the power supply circuit according to the first embodiment.

FIG. 9 is a block diagram showing an example of the operation of the power supply circuit 1 according to the first embodiment. In the power supply circuit 1 shown in FIG. 9, the power supply voltage (open circuit voltage) of the voltage source 11_1 is 0.2 V; the power supply voltage of the voltage source 11_2 is 0.2 V; the power supply voltage of the voltage source 11_3 is 0.3 V; the power supply voltage of the voltage source 11_4 is 0.4 V; and the power supply voltage of the voltage source 11_5 is 0.5V. The output impedance of each of the voltage sources 11_1 to 11_5 is 1 k$\Omega$.

Assume that the reference voltage Vref is set to 0.25 V; voltage sources each having a power supply voltage lower than the reference voltage are connected to the voltage control circuit 14_1; and voltage sources each having a power supply voltage equal to or higher than the reference voltage are connected to the voltage control circuit 14_2. In this case, since the power supply voltage of each of the voltage sources 11_1 and 11_2 is 0.2 V, which is lower than the reference voltage 0.25 V, the voltage source connection switch 13 connects the voltage sources 11_1 and 11_2 to the voltage control circuit 14_1. On the other hand, since the power supply voltages of the voltage sources 11_3, 11_4, and 11_5 are 0.3 V, 0.4 V, and 0.5 V, respectively, which are higher than the reference voltage 0.25 V, the voltage source connection switch 13 connects the voltage sources 11_3, 11_4, and 11_5 to the voltage control circuit 14_2.

Further, when the output voltage Vout of each of the voltage control circuits 14_1 and 14_2 is set to 1.5 V; the duty ratio of the clock signal CLK_1 supplied to the voltage control circuit 14_1 is set to 0.93; and the duty ratio of the clock signal CLK_2 supplied to the voltage control circuit 14_2 is set to 0.87, the input voltage Vin_1 of the voltage control circuit 14_1 is 0.1 V and the input voltage Vin_2 of the voltage control circuit 14_2 is 0.2 V.

At this time, since the potential difference between the power supply voltage V1 (0.2 V) of the voltage source 11_1 and the input voltage Vin_1 (0.1 V) of the voltage control circuit 14_1 is 0.1 V and the current supplied to the voltage control circuit 14_1 is 100 $\mu$A (=0.1 V/1 k$\Omega$), the power supplied from the voltage source 11_1 to the voltage control circuit 14_1 is 10 $\mu$W (=0.1 V×100 $\mu$A). Similarly, the power supplied from the voltage source 11_2 to the voltage control circuit 14_1 is 10 $\mu$W; the power supplied from the voltage source 11_3 to the voltage control circuit 14_2 is 20 $\mu$W; the power supplied from the voltage source 11_4 to the voltage control circuit 14_2 is 40 $\mu$W; and the power supplied from the voltage source 11_5 to the voltage control circuit 14_2 is 60 µW. Accordingly, the total power supplied from the voltage sources 11_1 to 11_5 to the voltage control circuits 14_1 and 14_2 is 140 µW.

Figure 10:
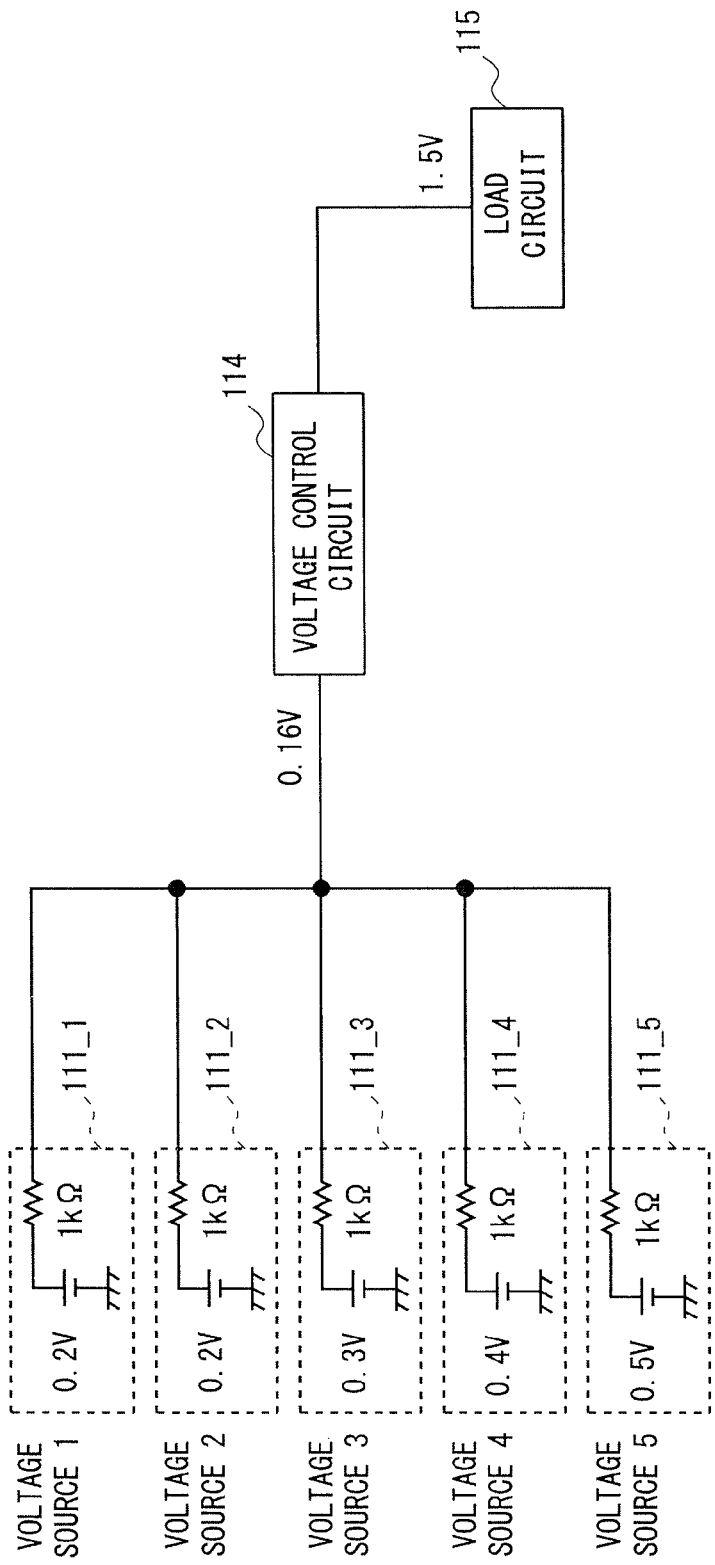
FIG. 10 is a block diagram showing an example of an operation of a power supply circuit according to a comparative example.

FIG. 10 is a block diagram showing an example of an operation of a power supply circuit according to a comparative example. In the power supply circuit shown in FIG. 10, all voltage sources 111_1 to 111_5 are connected to a single voltage control circuit 114. The power supply voltage and output impedance of each of the voltage sources 111_1 to 111_5 are similar to those of the power supply circuit shown in FIG. 9. When the output voltage of the voltage control circuit 114 is set to 1.5 V and the duty ratio of the clock signal supplied to the voltage control circuit is set to 0.91, the input voltage of the voltage control circuit 114 is 0.16 V.

At this time, the power supplied from the voltage source 111_1 to the voltage control circuit 114 is 6.5 µW; the power supplied from the voltage source 111_2 to the voltage control circuit 114 is 6.5 µW; the power supplied from the voltage source 111_3 to the voltage control circuit 114 is 22 µW; the power supplied from the voltage source 111_4 to the voltage control circuit 114 is 38 µW; and the power supplied from the voltage source 111_5 to the voltage control circuit 114 is 55 µW. Accordingly, the total power supplied from the voltage sources 111_1 to 111_5 to the voltage control circuit 114 is 128 µW.

Accordingly, when the power supply circuit 1 according to the first embodiment shown in FIG. 9 is compared with the power supply circuit according to the comparative example shown in FIG. 10, the input power is improved by about 10% in the power supply circuit 1 according to the first embodiment, as compared with the power supply circuit according to the comparative example. The reason for this will be described below.

The power input to each of the voltage control circuits 14_1 and 14_2 becomes maximum when the input voltages Vin_1 and Vin_2 of the voltage control circuits 14_1 and 14_2 are each one half of the power supply voltage (open circuit voltage) of each of the voltage sources 11_1 to 11_5. In other words, the power input to the voltage control circuits 14_1 and 14_2 decreases as the input voltages Vin_1 and Vin_2 of the voltage control circuits 14_1 and 14_2 deviate from a voltage that is one-half of the power supply voltage (open circuit voltage) of each of the voltage sources 11_1 to 11_5 connected to the voltage control circuits 14_1 and 14_2.

In the power supply circuit according to the comparative example shown in FIG. 10, all the voltage sources 111_1 to 111_5 are connected to a single voltage control circuit 114. Accordingly, in many of the voltage sources 111_1 to 111_5, the input voltage (0.16 V) of the voltage control circuit 114 deviates from the voltage that is one-half of the power supply voltage.

On the other hand, in the power supply circuit 1 according to the first embodiment shown in FIG. 9, the plurality of voltage control circuits 14_1 and 14_2 are provided, and the input voltage Vin_1 of the voltage control circuit 14_1 and the input voltage Vin_2 of the voltage control circuit 14_2 are set to 0.1 V and 0.2 V, respectively. The reference voltage is set to 0.25 V. The voltage sources 11_1 and 11_2 each having a power supply voltage lower than the reference voltage are connected to the voltage control circuit 14_1. The voltage sources 11_3 to 11_5 each having a power supply voltage equal to or higher than the reference voltage are connected to the voltage control circuit 14_2. This configuration makes it possible to reduce the number of voltage sources in which the input voltage of each of the voltage control circuits 14_1 and 14_2 deviates from the voltage that is one-half of the power supply voltage, among the voltage sources 11_1 to 11_5, thereby increasing the power input to the voltage control circuits 14_1 and 14_2.

For example, in the power supply circuit according to the first embodiment, the duty ratio of each of the clock signals CLK_1 and CLK_2, which are respectively supplied to the voltage control circuits 14_1 and 14_2, may be fixed to a predetermined value.

Further, in the power supply circuit according to the first embodiment, the clock signals CLK_1 and CLK_2 respectively supplied to the voltage control circuits 14_1 and 14_2 may be adjusted according to the power supply voltage of each of the voltage sources 11_1 to 11_5. In this case, the control circuit 18 can adjust the duty ratio of each of the clock signals CLK_1 and CLK_2, which are respectively supplied to the voltage control circuits 14_1 and 14_2, according to a monitoring result (i.e., the power supply voltage of each of the voltage sources 11_1 to 11_5) obtained from the voltage monitor circuit 17.

For example, when the power supply voltage of each of the voltage sources 11_1 and 11_2 decreases, the control circuit 18 may increase the duty ratio of the clock signal CLK_1 supplied to the voltage control circuit 14_1. As a result, the decrease in the output voltage Vout of the voltage control circuit 14_1 can be suppressed. On the other hand, when the power supply voltage of each of the voltage sources 11_1 and 11_2 increases, the control circuit 18 may decrease the duty ratio of the clock signal CLK_1 supplied to the voltage control circuit 14_1. As a result, the increase in the output voltage Vout of the voltage control circuit 14_1 can be suppressed.

While the case where the power supply circuit 1 includes five voltage sources has been described above, the number of voltage sources is not limited to this as long as three or more voltage sources are provided (i.e., when the number of voltage sources is represented by N, N≥3 holds). While the case where the power supply circuit 1 includes two voltage control circuits has been described above, the number of voltage control circuits is not limited to this as long as two or more voltage control circuits are provided (i.e., when the number of voltage control circuits is represented by k, K≥2 holds, provided that N≥K).

Second Embodiment

Figure 11:
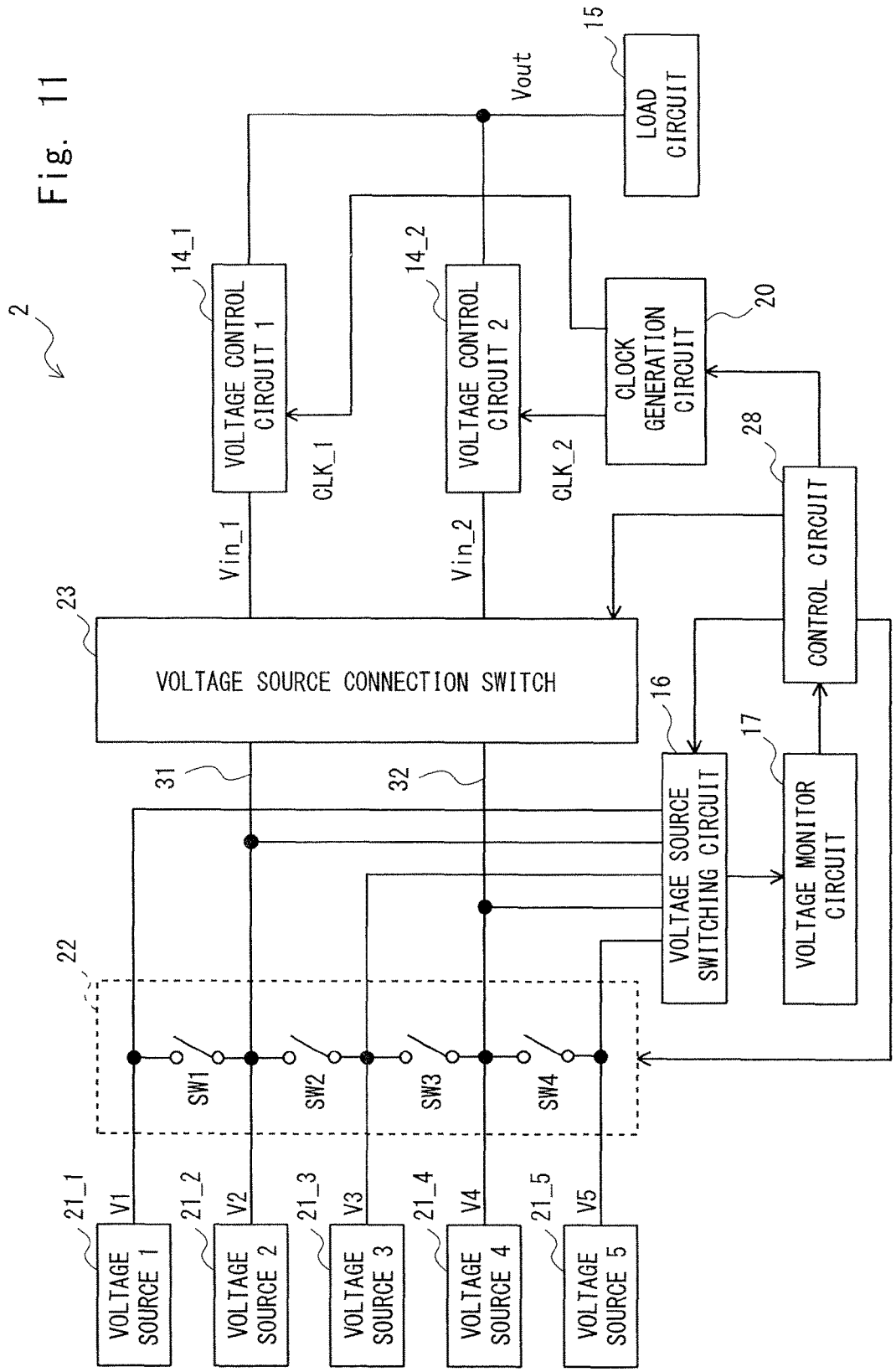
FIG. 11 is a block diagram showing a power supply circuit according to a second embodiment.

Next, a second embodiment will be described. FIG. 11 is a block diagram showing a power supply circuit 2 according to the second embodiment. The power supply circuit 2 according to the second embodiment differs from the power supply circuit 1 described in the first embodiment in that a voltage source switch 22 is provided.

As shown in FIG. 11, the power supply circuit 2 according to the second embodiment includes voltage sources 21_1 to 21_5, the voltage source switch 22, a voltage source connection switch 23, the voltage control circuits 14_1 and 14_2, the voltage source switching circuit 16, the voltage monitor circuit 17, the clock generation circuit 20, and a control circuit 28. The power supply circuit 2 supplied power to the load circuit 15. The voltage control circuits 14_1 and 14_2, the voltage source switching circuit 16, the voltage monitor circuit 17, and the clock generation circuit 20 are identical with those of the power supply circuit 1 described in the first embodiment. Accordingly, the components having the same configuration are denoted by the same reference numerals, and a repeated explanation thereof is omitted.

The voltage sources 21_1 to 21_5 generate the power supply voltages V1 to V5, respectively. In the power supply circuit 2 according to the second embodiment, the voltage sources 21_1 to 21_5 can be divided into two groups, i.e., a group including the voltage sources 21_2 and 21_4, which are directly connected to the voltage source connection switch 23 via wires 31 and 32, and a group including the voltage sources 21_1, 21_3, and 21_5, which are connected to the voltage source connection switch 23 via the voltage source switch 22.

The voltage sources 21_2 and 21_4 generate the power supply voltages V2 and V4, respectively, and output the generated power supply voltages V2 and V4 to each of the voltage source connection switch 23 and the voltage source switching circuit 16. The voltage sources 21_1, 21_3, and 21_5 generate the power supply voltages V1, V3, and V5, respectively, and output the generated power supply voltages V1, V3, and V5 to the voltage source switching circuit 16. The other configuration and operation of each of the voltage sources 21_1 to 21_5 are similar to those of the voltage sources 11_1 to 11_5 described in the first embodiment, and thus a repeated explanation thereof is omitted.

The voltage source switch 22 includes voltage source switches SW1 to SW4. The voltage source 21_1 and the voltage source 21_2 are configured to be connectable to each other via the voltage source switch SW1. The voltage source 21_2 and the voltage source 21_3 are configured to be connectable to each other via the voltage source switch SW2. The voltage source 21_3 and the voltage source 21_4 are configured to be connectable to each other via the voltage source switch SW3. The voltage source 21_4 and the voltage source 21_5 are configured to be connectable to each other via the voltage source switch SW4.

In other words, the voltage source switch 22 is configured to be able to connect an i ($1 \leq i \leq N-1$)-th voltage source and an (i+1)-th voltage source among N voltage sources (N=5 in the example shown in FIG. 11). At this time, among the N voltage sources, m voltage sources (m=2 in the example shown in FIG. 11) are directly connected to the voltage source connection switch 23. Among the N voltage sources, N-m voltage sources are connected to the voltage source connection switch 23 via the voltage source switch 22.

Further, the voltage source switch 22 connects the i-th voltage source and the (i+1)-th voltage source to each other when the voltage of the i-th voltage source and the voltage of the (i+1)-th voltage source fall within a predetermined range. For example, the voltage source switch 22 connects voltage sources each having a voltage lower than the predetermined reference voltage Vref among the N voltage sources, thereby forming a first voltage source group, and the voltage source switch 22 connects voltage sources each having a voltage equal to or higher than the predetermined reference voltage Vref among the N voltage sources, thereby forming a second voltage source group.

Figure 13:
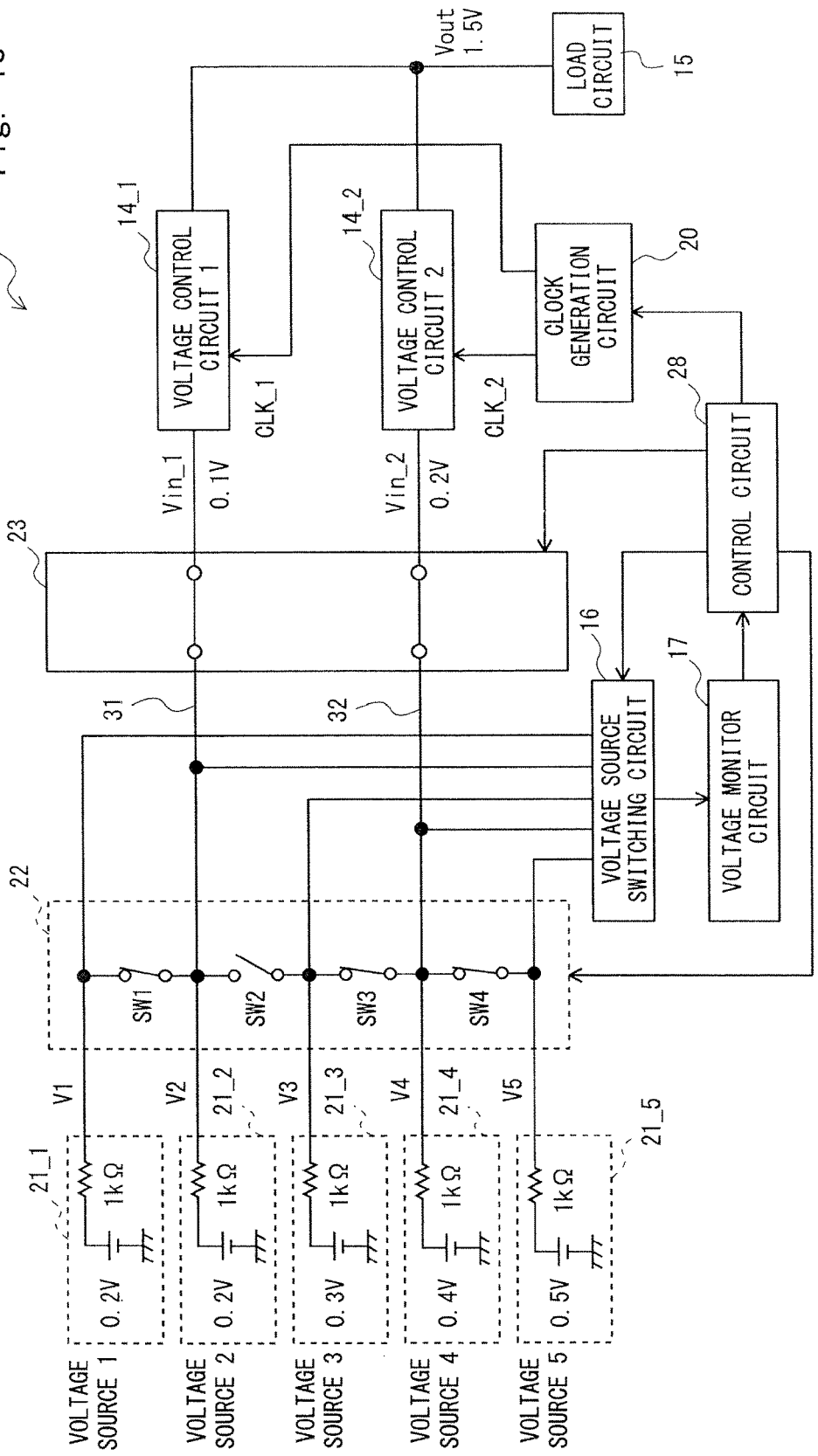
FIG. 13 is a block diagram showing an example of the operation of the power supply circuit according to the second embodiment.

For example, in the power supply circuit 2 shown in FIG. 11, when the power supply voltage V1 of the voltage source 21_1 and the power supply voltage V2 of the voltage source 21_2 are each lower than the reference voltage Vref, the voltage source switch 22 turns on the voltage source switch SW1 to connect the voltage source 21_1 and the voltage source 21_2 to each other, thereby forming the first voltage source group (see FIG. 13). At this time, the first voltage source group (voltage sources 21_1 and 21_2) is connected to the voltage source connection switch 23 via the wire 31.

When the power supply voltages V3 to V5 of the voltage sources 21_3 to 21_5 are each equal to or higher than the reference voltage Vref, the voltage source switch 22 turns on the voltage source switches SW3 and SW4 to connect the voltage sources 21_3 to 21_5 to each other, thereby forming the second voltage source group (see FIG. 13). At this time, the second voltage source group (voltage sources 21_3 to 21_5) is connected to the voltage source connection switch 23 via the wire 32.

As with the switch SW1_1 of the voltage source connection switch 23 shown in FIG. 3, for example, each of the voltage source switches SW1 to SW5 can be configured using an NMOS transistor, a PMOS transistor, and an inverter.

The voltage source connection switch 23 switches connection states between each of the first voltage source group (wire 31) and the second voltage source group (wire 32) and each of the voltage control circuits 14_1 and 14_2. Specifically, the voltage source connection switch 23 switches three connection states, i.e., a state in which the first voltage source group (wire 31) is connected to the voltage control circuit 14_1, a state in which the first voltage source group (wire 31) is connected to the voltage control circuit 14_2, and a state in which the first voltage source group (wire 31) is disconnected from both the voltage control circuits 14_1 and 14_2. Similarly, the voltage source connection switch 23 switches three connection states, i.e., a state in which the second voltage source group (wire 32) is connected to the voltage control circuit 14_1, a state in which the second voltage source group (wire 32) is connected to the voltage control circuit 14_2, and a state in which the second voltage source group (wire 32) is disconnected from both the voltage control circuits 14_1 and 14_2. Since the configuration of the voltage source connection switch 23 is similar to that of the voltage source connection switch 13 (see FIGS. 2 and 3) described in the first embodiment, a repeated explanation thereof is omitted.

In the power supply circuit 2 according to the second embodiment, the control circuit 28 is configured to be able to further control the voltage source switch 22. The other configuration and operation of the control circuit 28 are similar to those of the control circuit 18 described in the first embodiment, and thus a repeated explanation thereof is omitted.

Next, the operation of the power supply circuit 2 according to the second embodiment will be described with reference to a timing diagram shown in FIG. 12. The power supply circuit 2 according to the second embodiment has operating modes including a monitor mode and a normal mode. The normal mode is a mode in which at least one of the voltage sources 21_1 to 21_5 is connected to one of the voltage control circuit 14_1 and the voltage control circuit 14_2 by using the voltage source switch 22 and the voltage source connection switch 23, thereby supplying power to the load circuit 15. The monitor mode is a mode in which the power supply voltages V1 to V5 of the voltage sources 21_1 to 21_5 are monitored by the voltage monitor circuit 17.

In the monitor mode, when the power supply voltage V1 of the voltage source 21_1 is monitored by the voltage monitor circuit 17, the voltage source switch SW1 is turned off to thereby cause the voltage source 21_1 and the voltage source connection switch 23 to be electrically disconnected from each other. At this time, as in the case of the normal mode, the other voltage sources 21_2 to 21_5 are connected to one of the voltage control circuit 14_1 and the voltage control circuit 14_2. Accordingly, also in the monitor mode, the load circuit 15 is supplied with power. The same holds true for the voltage source 21_3 and the voltage source 21_5.

Further, in the monitor mode, when the power supply voltage V2 of the voltage source 21_2 is monitored by the voltage monitor circuit 17, the voltage source switches SW1 and SW2 and the voltage source connection switch are turned off to thereby cause the voltage source 21_2 to be connected only to the voltage monitor circuit 17. At this time, the supply of power to the voltage control circuit 14_1 or the voltage control circuit 14_2 via the wire 31 is interrupted. On the other hand, the supply of power to the voltage control circuit 14_1 or the voltage control circuit 14_2 via the wire 32 is continued. The same holds true for the voltage source 21_4.

The voltage control circuit 14_1 is supplied with the clock signal CLK_1 having a predetermined duty ratio, and the voltage control circuit 14_2 is supplied with the clock signal CLK_2 having a predetermined duty ratio.

Figure 12:
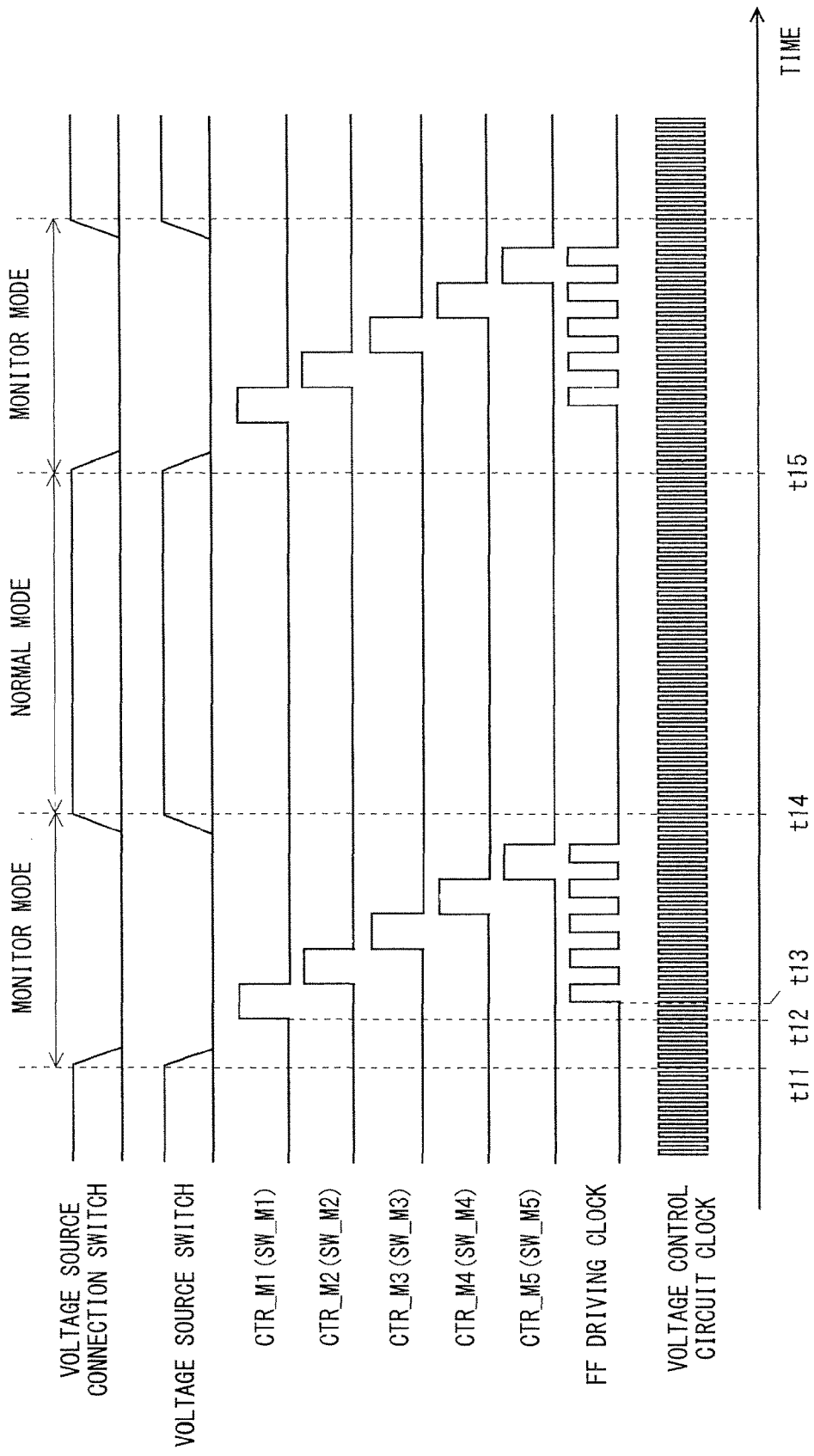
FIG. 12 is a timing diagram showing an operation of the power supply circuit according to the second embodiment.

As shown in FIG. 12, the voltage source switch 22 and the voltage source connection switch 23 shift from the normal mode to the monitor mode at timing t11. Next, at timing t12, when the control signal CTR_M1 of the switch SW_M1 (see FIG. 5), which is included in the voltage source switching circuit 16, becomes the high level, the switch SW_M1 is turned on and the power supply voltage V1 of the voltage source 21_1 is output to the voltage monitor circuit 17. At this time, the voltage source switch SW1 is turned off to thereby cause the voltage source 21_1 and the voltage source connection switch 23 to be disconnected from each other.

The voltage monitor circuit 17 compares the power supply voltage V1 of the voltage source 21_1 with the reference voltage Vref, and outputs the comparison result OUT_M1. For example, when the power supply voltage V1 of the voltage source 21_1 is lower than the reference voltage Vref, the voltage monitor circuit 17 outputs a low-level signal as the comparison result OUT_M1. On the other hand, when the power supply voltage V1 of the voltage source 21_1 is equal to or higher than the reference voltage Vref, the voltage monitor circuit 17 outputs a high-level signal as the comparison result OUT_M1.

At timing t13, when a driving clock for the flip-flop FF1 that stores the comparison result OUT_M1 becomes the high level, the comparison result OUT_M1 (information on the voltage of the voltage source 21_1) is stored in the flip-flop FF1. After that, the control signals CTR_M2 to CTR_M5 are sequentially brought to the high level, and as in the case of the voltage source 21_1, the power supply voltages V2 to V5 of the voltage sources 21_2 to 21_5 are compared with the reference voltage Vref, and the comparison results OUT_M2 to OUT_M5 are respectively stored in the flip-flops FF2 to FF5.

After that, at timing t14, the voltage source switch 22 and the voltage source connection switch 23 shift from the monitor mode to the normal mode. In the normal mode, the voltage source switch 22 and the voltage source connection switch 23 connect at least one of the voltage sources 21_1 to 21_5 to one of the voltage control circuits 14_1 and 14_2 according to the comparison results OUT_M1 to OUT_M5 (i.e., information on the voltage of each of the voltage sources 21_1 to 21_5) which are respectively stored in the flip-flops FF1 to FF5. Thus, the state of the power supply voltage of each of the voltage sources 21_1 to 21_5 monitored in the monitor mode is reflected in the connection state of each of the voltage source switch 22 and the voltage source connection switch 23.

Specifically, when the comparison results of the adjacent voltage sources (i.e., the comparison results OUT_M1 to OUT_M5 which are respectively stored in the flip-flops FF1 to FF5 and indicate the value of "0" or "1"), which are measured in the voltage monitor circuit, are the same, the voltage source switch 22 turns on the corresponding voltage source switch 22. For example, when the comparison results OUT_M1 and OUT_M2 of the voltage sources 21_1 and 21_2 are the same, the voltage source switch SW1 corresponding to the voltage sources 21_1 and 21_2 is turned on. For example, when the comparison results OUT_M3 to OUT_M5 of the voltage sources 21_3 to 21_5 are the same, the voltage source switches SW3 and SW4 corresponding to the voltage sources 21_3 to 21_5 are turned on.

The voltage source connection switch 23 switches the connection states between each of the first voltage source group (wire 31) and the second voltage source group (wire 32) and each of the voltage control circuits 14_1 and 14_2. For example, the voltage source connection switch 23 connects, to the voltage control circuit 14_1, the first voltage source group (wire 31) when the comparison results OUT_M1 and OUT_M2 indicate "0". For example, the voltage source connection switch 23 connects, to the voltage control circuit 14_2, the second voltage source group (wire 32) when the comparison results OUT_M3 to OUT_M5 indicate "1". As a result, voltage sources each having a voltage lower than the predetermined reference voltage Vref among the voltage sources 21_1 to 21_5 can be connected to the voltage control circuit 14_1, and voltage sources each having a voltage equal to or higher than the predetermined reference voltage Vref among the voltage sources 21_1 to 21_5 can be connected to the voltage control circuit 14_2. Therefore, the voltage sources each having substantially the same power supply voltage can be connected to the same voltage control circuit.

After that, the voltage source switch 22 and the voltage source connection switch 23 shift from the normal mode to the monitor mode again at timing t15. Subsequently, the above-described operation is repeated.

When the voltage source group formed using the voltage source switch 22 does not include any voltage source that is directly connected to the voltage source connection switch 23, a voltage source switch between voltage sources included in the adjacent voltage source groups (i.e., voltage sources directly connected to the voltage source connection switch 23) may be turned on.

In other words, when all voltage source switches between voltage sources ranging from an a-th voltage source to a b-th voltage source (1≤a<b≤N) among the N voltage sources are in the ON state and the voltage sources ranging from the a-th voltage source to the b-th voltage source do not include any voltage source that is directly connected to the voltage source connection switch 23, the voltage source switch between an (a−1)-th voltage source and the a-th voltage source, or the voltage source switch between the b-th voltage source and a (b+1)-th voltage source may be turned on.

FIG. 13 is a block diagram showing an example of the operation of the power supply circuit 2 according to the second embodiment. In the power supply circuit 2 shown in FIG. 13, the power supply voltage (open circuit voltage) of the voltage source 21_1 is 0.2 V; the power supply voltage of the voltage source 21_2 is 0.2 V; the power supply voltage of the voltage source 21_3 is 0.3 V; the power supply voltage of the voltage source 21_4 is 0.4 V; and the power supply voltage of the voltage source 21_5 is 0.5V. The output impedance of each of the voltage sources 21_1 to 21_5 is 1 kΩ.

Assume that the reference voltage Vref is set to 0.25 V; voltage sources each having a power supply voltage lower than the reference voltage among the voltage sources are connected to the voltage control circuit 14_1; and voltage sources each having a power supply voltage equal to or higher than the reference voltage among the voltage sources are connected to the voltage control circuit 14_2. In this case, since the power supply voltage of each of the voltage sources 21_1 and 21_2 is 0.2 V, which is lower than the reference voltage 0.25 V, the voltage source switch SW1 is turned on and the voltage source connection switch 23 connects the wire 31 to the voltage control circuit 14_1. This allows the voltage sources 21_1 and 21_2 to be electrically connected to the voltage control circuit 14_1.

On the other hand, since the power supply voltages of the voltage sources 21_3, 21_4, and 21_5 are 0.3V, 0.4V, and 0.5V, respectively, which are higher than the reference voltage 0.25 V, the voltage source switches SW3 and SW4 are turned on and the voltage source connection switch 23 connects the wire 32 to the voltage control circuit 14_2. This allows the voltage sources 21_3 to 21_5 to be electrically connected to the voltage control circuit 14_2.

Further, when the output voltage Vout of each of the voltage control circuits 14_1 and 14_2 is set to 1.5 V; the duty ratio of the clock signal CLK_1 supplied to the voltage control circuit 14_1 is set to 0.93; and the duty ratio of the clock signal CLK_2 supplied to the voltage control circuit 14_2 is set to 0.87, the input voltage Vin_1 of the voltage control circuit 14_1 is 0.1 V and the input voltage Vin_2 of the voltage control circuit 14_2 is 0.2 V.

At this time, since the potential difference between the power supply voltage V1 (0.2 V) of the voltage source 21_1 and the input voltage Vin_1 (0.1 V) of the voltage control circuit 14_1 is 0.1 V and the current supplied to the voltage control circuit 14_1 is 100 μA (=0.1 V/1 kΩ), the power supplied from the voltage source 21_1 to the voltage control circuit 14_1 is 10 μW (=0.1 V×100 μA). Similarly, the power supplied from the voltage source 21_2 to the voltage control circuit 14_1 is 10 μW; the power supplied from the voltage source 21_3 to the voltage control circuit 14_2 is 20 μW; the power supplied from the voltage source 21_4 to the voltage control circuit 14_2 is 40 μW; and the power supplied from the voltage source 21_5 to the voltage control circuit 14_2 is 60 μW. Accordingly, the total power supplied from the voltage sources 21_1 to 21_5 to the voltage control circuits 14_1 and 14_2 is 140 μW, and for the same reason as that mentioned in the first embodiment, the power can be effectively extracted from each of the voltage sources 21_1 to 21_5.

Especially in the power supply circuit 2 according to the second embodiment, when the power supply voltages of the adjacent voltage sources fall within a predetermined range, voltage source groups are formed using the voltage source switches 22 (in other words, the plurality of voltage sources are divided into groups). Therefore, the number of wires (corresponding to the wires 31 and 32) on the input side of the voltage source connection switch 23 can be reduced, with the result that the configuration of the voltage source connection switch 23 can be simplified.

It is preferable to uniformly arrange the voltage sources which are directly connected to the voltage source connection switch 23 among the plurality of voltage sources.

While the case where the power supply circuit 2 includes five voltage sources has been described above, the number of voltage sources is not limited to this as long as three or more voltage sources are provided (i.e., when the number of voltage sources is represented by N, N≥3 holds). While the case where the power supply circuit 2 includes two voltage control circuits has been described above, the number of voltage control circuits is not limited to this as long as two or more voltage control circuits are provided (i.e., when the number of voltage control circuits is represented by K, K≥2 holds, provided that N≥K).

Assuming herein that m (m is a natural number smaller than N) voltage sources among the N voltage sources are directly connected to the voltage source connection switch 23, "N", "K", and "m" are preferably set so as to satisfy (N−1)+(m×K)<N×K, in order to reduce the number of switches that constitute the voltage source connection switch 23.

When the power supply voltage varies widely between the adjacent voltage sources, the power supply circuit 1 described in the first embodiment can be used.

Third Embodiment

Figure 14:
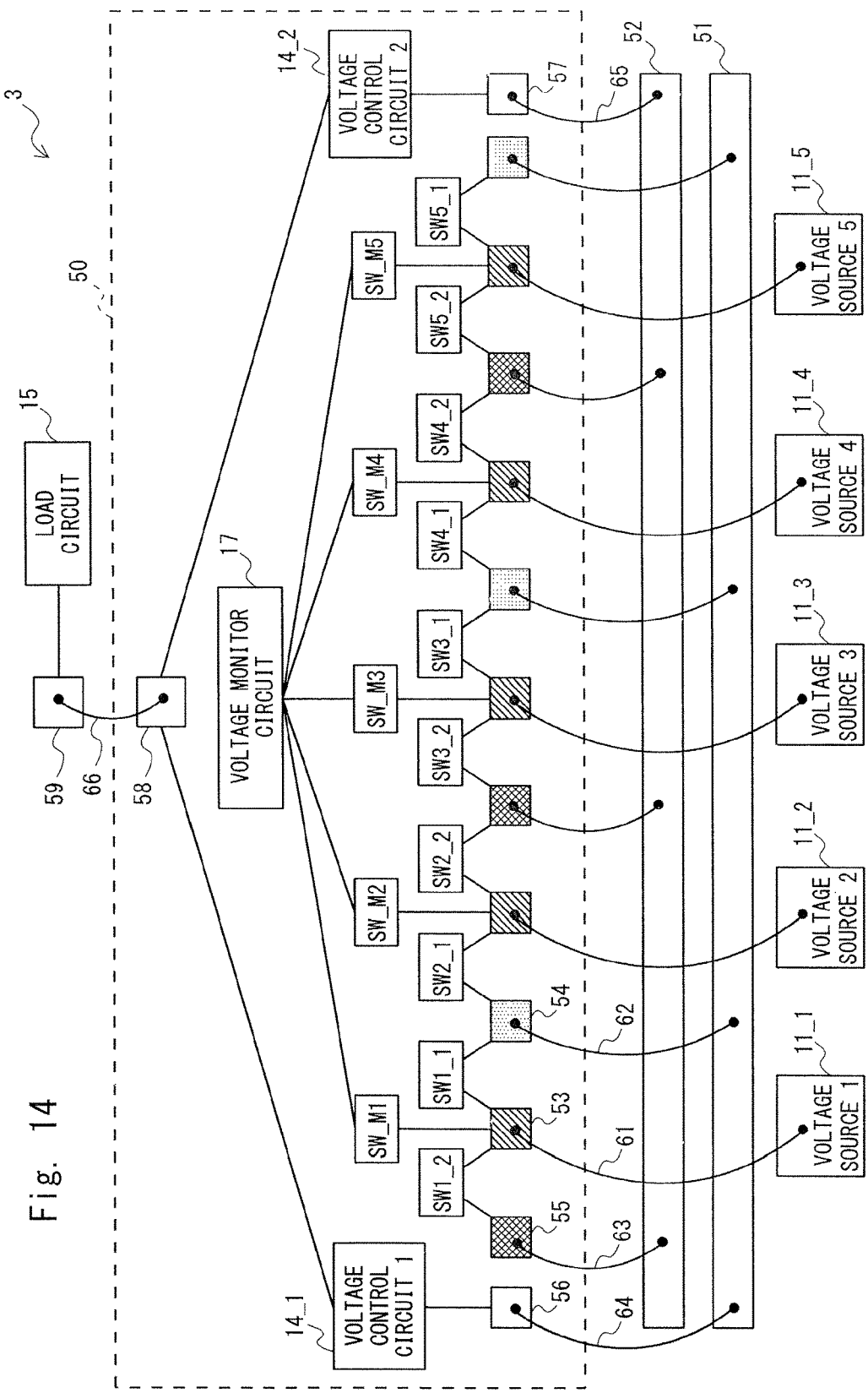
FIG. 14 is a diagram showing a configuration example of a power supply circuit according to a third embodiment.

Next, a third embodiment will be described. The third embodiment illustrates a configuration example in which the power supply circuit 1 described in the first embodiment is mounted on a semiconductor chip (hereinafter referred to as a chip). FIG. 14 is a diagram showing a configuration example of a power supply circuit according to the third embodiment. As shown in FIG. 14, in a power supply circuit 3 according to the third embodiment, the switches SW1_1 to SW5_1 and SW1_2 to SW5_2 (see FIG. 2), which constitute the voltage source connection switch 13, the switches SW_M1 to SW_M5 (see FIG. 5), which constitute the voltage source switching circuit 16, the voltage control circuits 14_1 and 14_2, the voltage monitor circuit 17, and pads 53 to 58 are arranged on a chip 50. At the outside of the chip 50, the voltage sources 11_1 to 11_5, a first wire 51, a second wire 52, a pad 59, and the load circuit 15 are arranged.

The voltage source 11_1 is connected to the voltage source pad (third pad) 53 by a bonding wire 61. The voltage source pad 53 is connected to the first pad 54 via the switch SW1_1. In this case, one end of the switch SW1_1 and the voltage source pad 53 are connected to each other by an in-chip wire, and the other end of the switch SW1_1 and the first pad 54 are connected to each other by an in-chip wire. The first pad 54 is connected to the first wire 51 by a bonding wire 62. The other voltage sources 11_2 to 11_5 and the other switches SW2_1 to SW5_1 are connected in a manner similar to that described above. The first wire 51 is connected to the pad 56 by a bonding wire 64. The pad 56 is connected to the voltage control circuit 14_1 by an in-chip wire. The voltage control circuit 14_1 is connected to the pad 58 by an in-chip wire. The first pad 54 described herein refers to a pad that is electrically connected to the voltage control circuit 14_1.

Similarly, the voltage source pad 53 is connected to the second pad 55 via the switch SW1_2. In this case, one end of the switch SW1_2 and the voltage source pad 53 are connected to each other by an in-chip wire, and the other end of the switch SW1_2 and the second pad 55 are connected to each other by an in-chip wire. The second pad 55 is connected to the second wire 52 by a bonding wire 63. The other switches SW2_2 to SW5_2 have a configuration similar to that of the switch SW1_2. The second wire 52 is connected to the pad 57 by a bonding wire 65. The pad 57 is connected to the voltage control circuit 14_2 by an in-chip wire. The voltage control circuit 14_2 is connected to the pad 58 by an in-chip wire. The second pad 55 described herein refers to a pad that is electrically connected to the voltage control circuit 14_2.

The voltage source pad 53 is connected to the voltage monitor circuit 17 via the switch SW_M1 constituting the voltage source switching circuit 16. The other switches SW_M2 to SW_M5 have a configuration similar to that of the switch SW_M1. The pad 58 is connected to the pad 59 by a bonding wire 66. The pad 59 is connected to the load circuit 15. The voltage source pad 53, the first pad 54, the second pad 55, and the pads 56 and 57 are formed at an end of the chip 50 on the side of the first and second wires 51 and 52.

In this manner, in the power supply circuit 3 according to the third embodiment, the voltage control circuit 14_1, the voltage control circuit 14_2, and the voltage source connection switches SW1_1 to SW5_1 and SW1_2 to SW5_2 are formed on the same chip. The voltage control circuit 14_1 and the voltage source connection switches SW1_1 to SW5_1 are connected to each other via the first wire 51 which is formed outside the chip 50. The voltage control circuit 14_2 and the voltage source connection switches SW1_2 to SW5_2 are connected to each other via the second wire 52 which is formed outside the chip 50. The voltage source connection switches SW1_1 to SW5_1 (first switches) described herein refer to switches that switch connections between each of the voltage sources 11_1 to 11_5 and the voltage control circuit 14_1. The voltage source connection switches SW1_2 to SW5_2 (second switches) described herein refer to switches that switch connections between each of the voltage sources 11_1 to 11_5 and the voltage control circuit 14_2.

The first wire 51 and the second wire 52 are wires which are arranged outside the chip 50 and have a resistance lower than that of each wire in the chip 50 (in-chip wire). Accordingly, in the power supply circuit 3 according to the third embodiment, the wiring resistance of the wires, which connect the voltage control circuit 14_1 and the voltage source connection switches SW1_1 to SW5_1 to each other, and the wiring resistance of the wires, which connect the voltage control circuit 14_2 and the voltage source connection switches SW1_2 to SW5_2 to each other, can be reduced.

Figure 15:
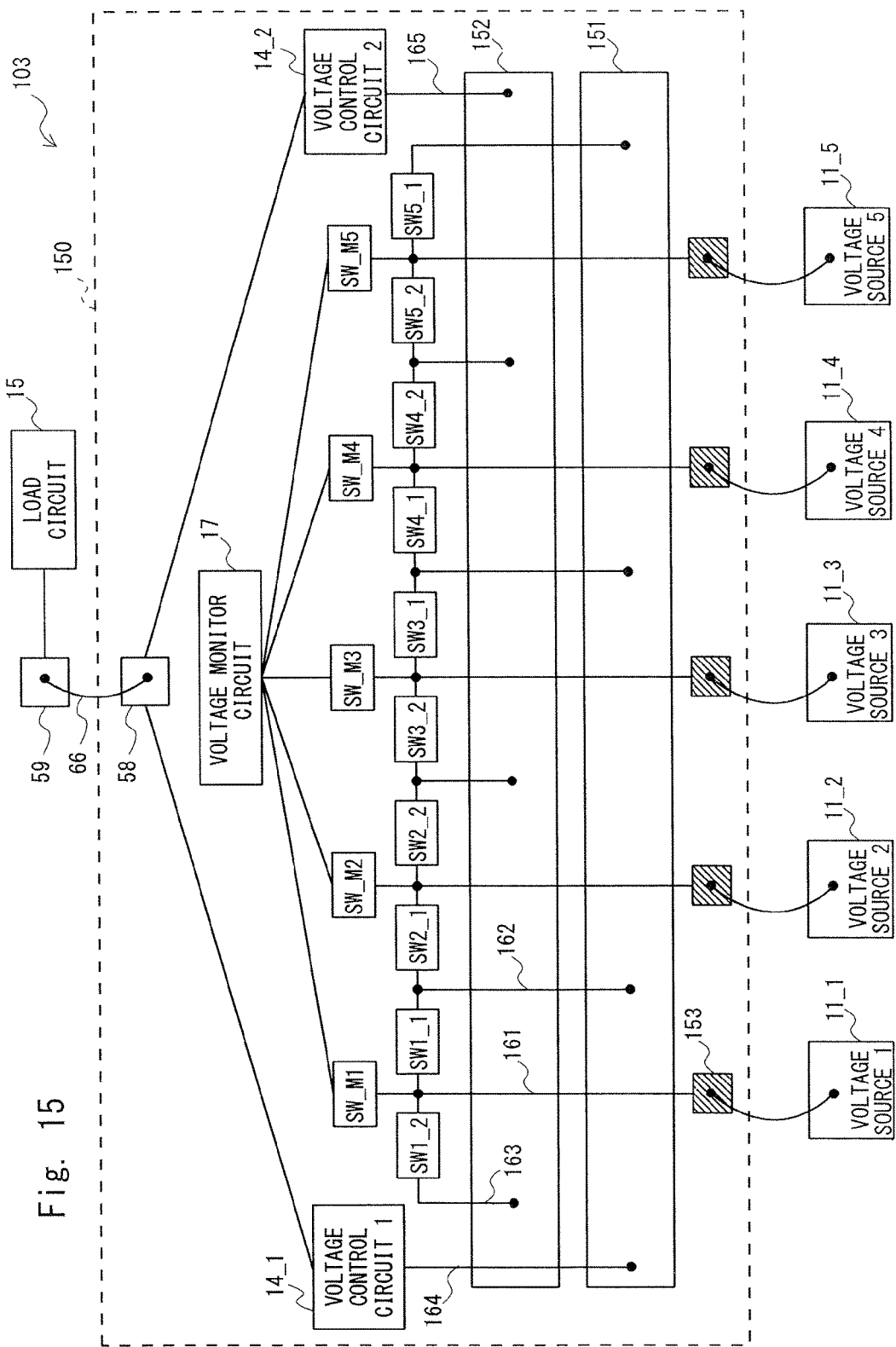
FIG. 15 is a diagram showing a power supply circuit according to a comparative example.

FIG. 15 is a diagram showing a power supply circuit 103 according to a comparative example. The comparative example shown in FIG. 15 illustrates the case where the first wire 51 and the second wire 52 (hereinafter referred to also as the out-chip wires 51 and 52) shown in FIG. 14 are configured using in-chip wires 151 and 152. In the power supply circuit 103 shown in FIG. 15, the components identical with those of the power supply circuit 3 shown in FIG. 14 are denoted by the same reference numerals.

As shown in FIG. 15, in the power supply circuit 103 according to the comparative example, the in-chip wires 151 and 152 are formed in a chip 150. The voltage source 11_1 is connected to a voltage source pad 153 by a bonding wire. The voltage source pad 153 is connected to one end of the switch SW1_1, one end of the switch SW1_2, and one end of the switch SW_M1 by a wire 161. The other end of the switch SW1_1 is connected to the in-chip wire 151 by a wire 162. The other end of the switch SW1_2 is connected to the in-chip wire 152 by a wire 163. The other end of the switch SW_M1 is connected to the voltage monitor circuit 17. The other voltage sources 11_2 to 11_5 and the other switches SW2_1 to SW5_1 and SW_M2 to SW_M5 have a configuration similar to that described above. The voltage control circuit 14_1 is connected to the in-chip wire 151 by a wire 164. The voltage control circuit 14_2 is connected to the in-chip wire 152 by a wire 165.

In the comparative example shown in FIG. 15, the width of each of the in-chip wires 151 and 152 needs to be increased (for example, 1 mm or more) in order to reduce the wiring resistance of each of the in-chip wires 151 and 152 (to be substantially equal to the wiring resistance of the out-chip wires 51 and 52 shown in FIG. 14). For this reason, when the in-chip wires 151 and 152 are formed in the chip 150, the chip area increases. Therefore, in the third embodiment, the out-chip wires 51 and 52 are preferably used as shown in FIG. 14, which leads to a significant reduction in the chip area.

Figure 16:
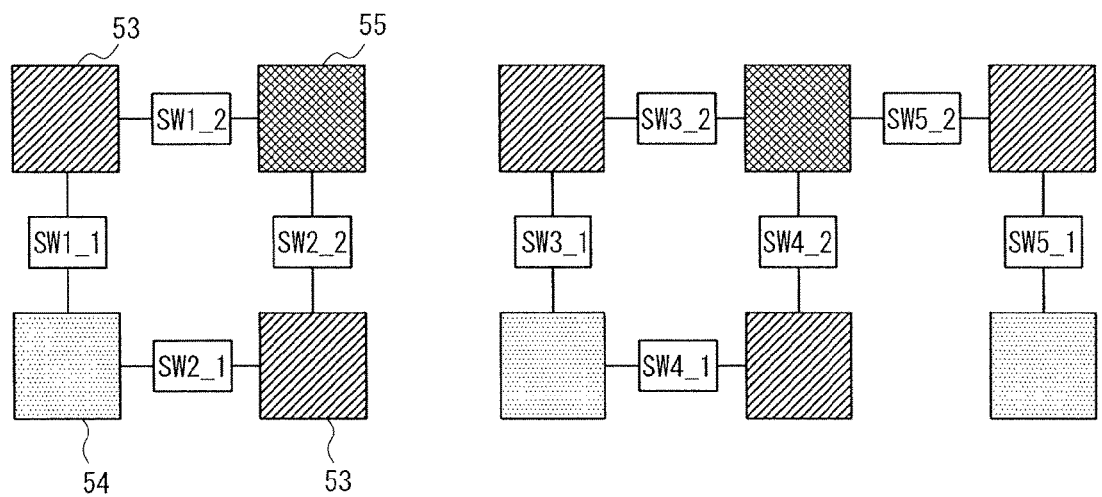
FIG. 16 is a diagram showing an example of a layout of pads included in the power supply circuit according to the third embodiment.

In the power supply circuit 3 according to the third embodiment, the voltage source pad 53, the first pad 54, and the second pad 55 may be arranged as shown in FIG. 16. That is, the respective pads may be arranged in two rows in such a manner that two voltage source pads 53 are connected to a single first pad 54, or two voltage source pads 53 are connected to a single second pad 55. At this time, each of the voltage source connection switches SW1_1 to SW5_1 and SW1_2 to SW5_2 is provided between the respective pads. The pads are connected to each other by an in-chip wire.

In this manner, the arrangement of the pads as shown in FIG. 16 allows two voltage source pads 53 to share a single first pad 54 and a single second pad 55, which leads to a reduction in the number of pads.

Figure 17:
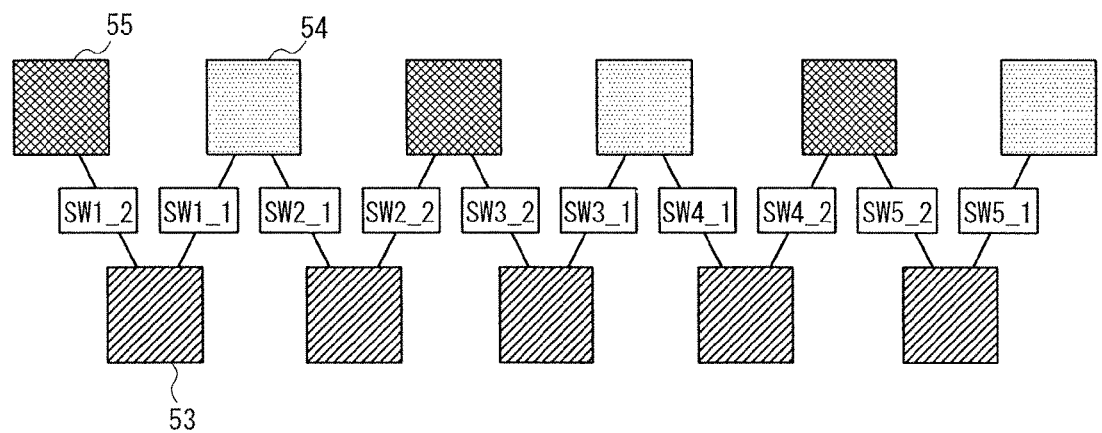
FIG. 17 is a diagram showing an example of the layout of the pads included in the power supply circuit according to the third embodiment.

Further, in the power supply circuit 3 according to the third embodiment, the voltage source pad 53, the first pad 54, and the second pad 55 may be arranged as shown in FIG. 17. That is, the pads may be arranged in two rows, and may be further arranged in a staggered manner. At this time, the voltage source pads 53 are arranged in the first row, and the first and second pads 54 and 55 are arranged in the second row. The state in which the pads are connected to each other as shown in FIG. 17 is similar to that shown in FIG. 14. Also in this case, each of the voltage source connection switches SW1_1 to SW5_1 and SW1_2 to SW5_2 is provided between the respective pads. The pads are connected to each other by an in-chip wire.

The arrangement of the pads as shown in FIG. 17 makes it possible to reduce the length in the lateral direction of the area occupied by the pads. Further, the arrangement of the pads in a staggered manner makes it possible to suppress the interference between the bonding wires connected to the respective pads.

Figure 18:
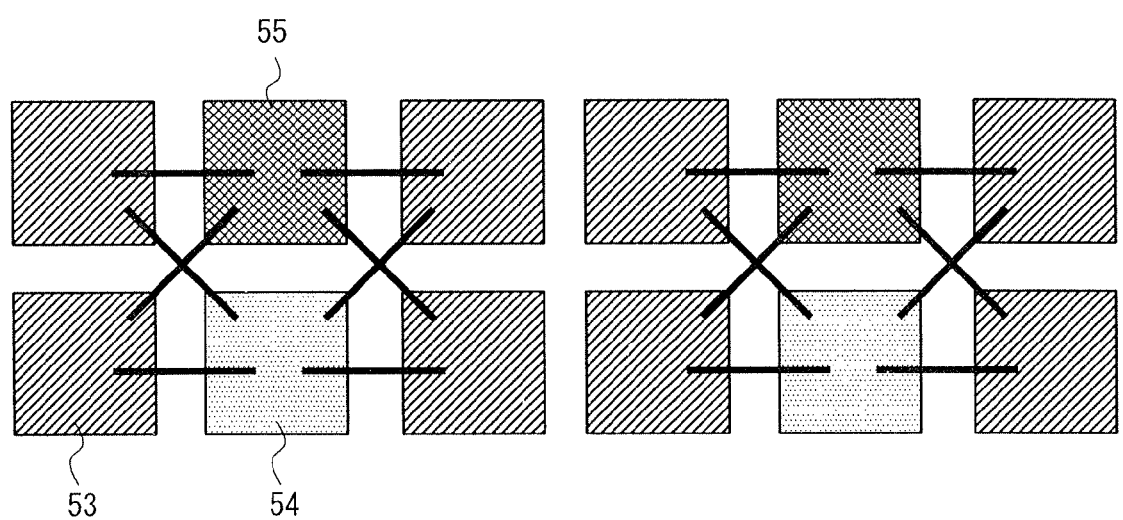
FIG. 18 is a diagram showing an example of the layout of the pads included in the power supply circuit according to the third embodiment.

For example, when a number of (for example, eight) voltage sources are provided, the pads may be arranged as shown in FIG. 18. That is, the respective pads may be arranged in two rows in such a manner that four voltage source pads 53 are connected to a single first pad 54 and the four voltage source pads 53 are also connected to a single second pad 55. Also in this case, each of the voltage source connection switches is provided between the respective pads. The pads are connected to each other by an in-chip wire.

In this manner, the arrangement of the pads as shown in FIG. 18 allows four voltage source pads 53 to share a single first pad 54 and a single second pad 55, thereby suppressing an increase in the number of pads.

Fourth Embodiment

Next, a fourth embodiment will be described. The fourth embodiment illustrates a configuration example of a power supply system using the power supply circuits 1 to 3, which are respectively described in the first to third embodiments, specifically, a configuration example of an energy harvesting system in which the power supply circuits 1 to 3 respectively described in the first to third embodiments are mounted on a semiconductor chip.

Figure 19:
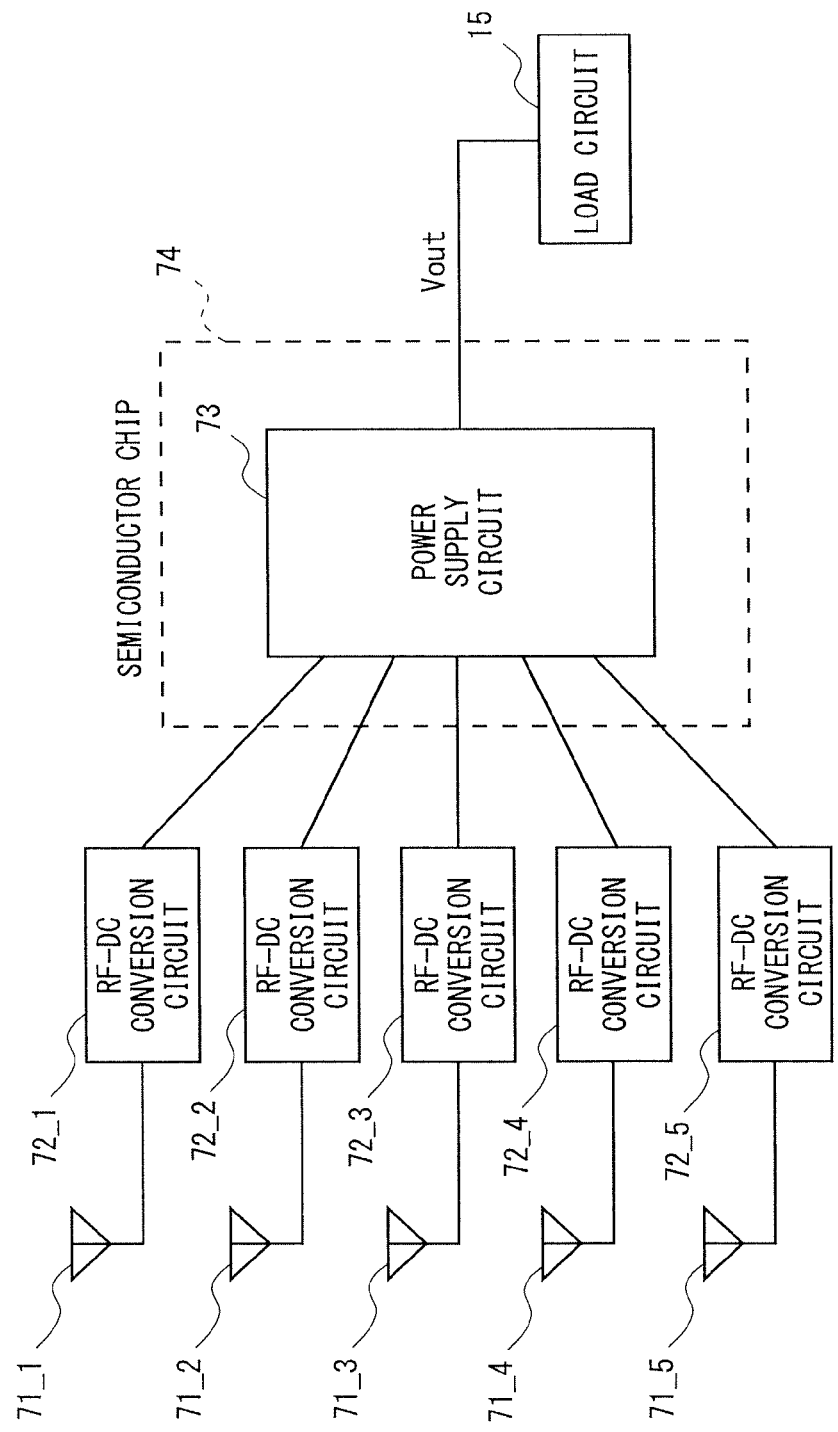
FIG. 19 is a block diagram showing an example of a power supply system according to a fourth embodiment.

FIG. 19 is a block diagram showing an example of the power supply system according to the fourth embodiment. As shown in FIG. 19, the power supply system according to the fourth embodiment includes antennas 71_1 to 71_5, RF-DC conversion circuits 72_1 to 72_5, a power supply circuit 73, and the load circuit 15. The antennas 71_1 to 71_5 and the RF-DC conversion circuits 72_1 to 72_5 respectively correspond to the voltage sources 11_1 to 11_5 described in the first to third embodiments. The power supply circuit 73 corresponds to each of the power supply circuits 1 to 3 respectively described in the first to third embodiments (except for the voltage sources 11_1 to 11_5).

The antennas 71_1 to 71_5 each receive radio waves in a predetermined frequency band, and output the received AC signals to the RF-DC conversion circuits 72_1 to 72_5, respectively. The antennas 71_1 to 71_5 are configured to be able to receive radio waves in the frequency bands which are commonly used in the environment in which the power supply system is placed (that is, high-energy frequency bands). The antennas 71_1 to 71_5 may be configured to be able to receive radio waves in a single frequency band, or may be configured to be able to receive radio waves in a plurality of frequency bands.

The RF-DC conversion circuits 72_1 to 72_5 are provided so as to respectively correspond to the antennas 71_1 to 71_5, convert AC signals received by the antennas 71_1 to 71_5 into DC signals, and output the DC signals, which are obtained after the conversion, to the power supply circuit 73.

The power supply circuit 73 generates a power supply voltage by using the power supplied from the RF-DC conversion circuits 72_1 to 72_5, and supplies the generated power supply voltage to the load circuit 15. The power supply circuit 73 can be configured using a semiconductor chip 74. The configuration and operation of the power supply circuit 73 are similar to those of the power supply circuits 1 to 3, which are respectively described in the first to third embodiments, and thus the detailed description thereof is omitted.

According to the energy harvesting technique, in general, the radio energy that is radiated toward an unspecified number of antennas from a radio tower or a cellular phone base station is recovered, instead of recovering the radio energy that is directed toward the antennas 71_1 to 71_5. Therefore, in order to recover more energy, it is preferable to use antennas capable of receiving radio waves in the frequency bands that are commonly used, such as radio waves in a frequency band for cellular phones, radio waves in a frequency band for wireless LAN, or radio waves in a frequency band for digital terrestrial broadcasting.

Figure 20:
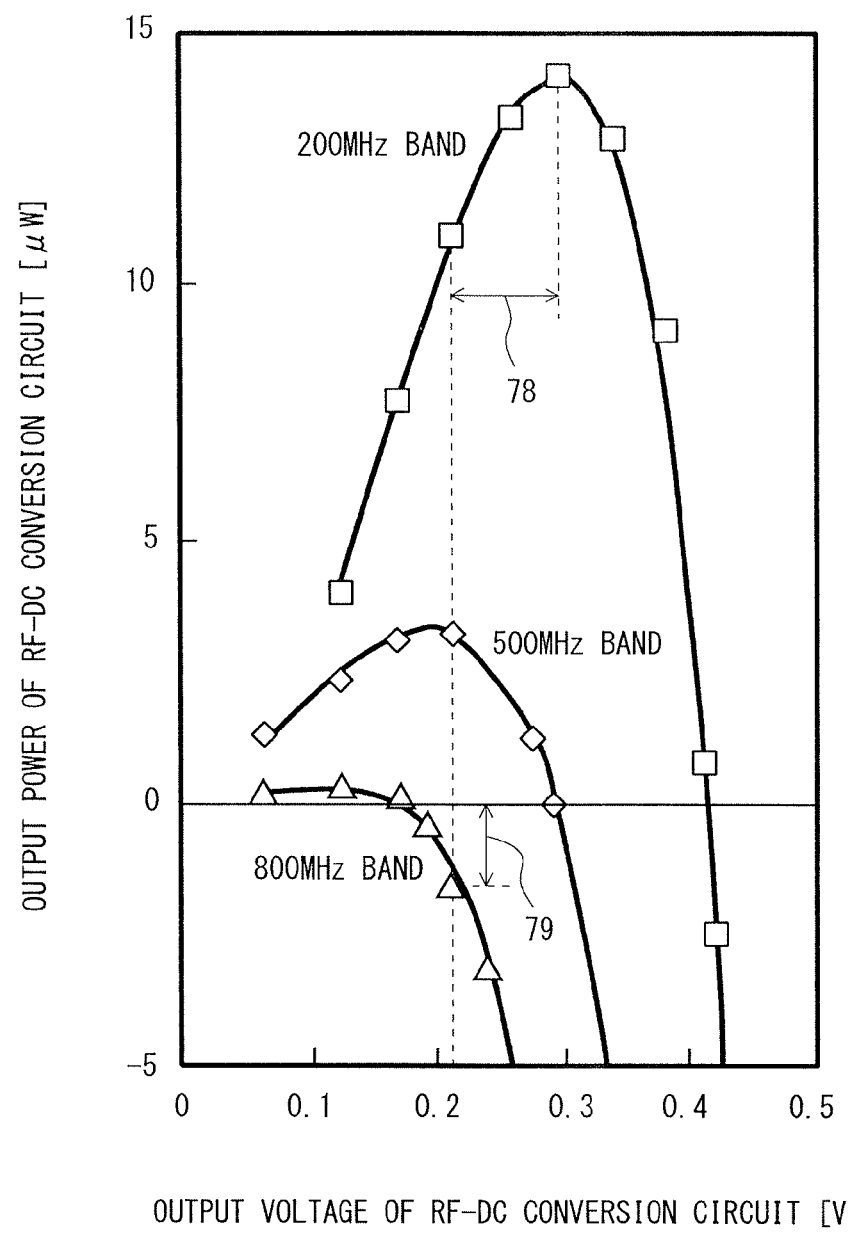
FIG. 20 is a graph showing a relationship between an output voltage and output power of an RF-DC conversion circuit.

FIG. 20 is a graph showing an example of the power recovered by the antennas 71_1 to 71_5, and also showing a relationship between an output voltage and output power of the RF-DC conversion circuit. The example shown in FIG. 20 illustrates the case where an antenna for 200 MHz band is used as the antenna 71_1; antennas for 500 MHz band are used as the antennas 71_2 and 71_3; and antennas for 800 MHz band are used as the antennas 71_4 and 71_5.

The intensity of the radio energy in each frequency band varies depending on the location and time. Accordingly, it is a rare situation that the intensities of the radio energy in all the frequency bands are at substantially the same level. The outputs of the antennas for 200 MHz band, 500 MHz band, and 800 MHz band, are −14 dBm, −20 dBm, and −26 dBm, respectively, which are different from each other. The relationship between the output voltage and the output power of the RF-DC conversion circuit is shown in FIG. 20.

When the voltage control circuit has one input (see FIG. 10), for example, assuming that all the outputs of the RF-DC conversion circuits 72_1 to 72_5 are supplied to a single voltage control circuit and the RF-DC conversion circuits 72_1 to 72_5 each have an output of 0.2 V, the power that can be recovered from the RF-DC conversion circuits 72_2 and 72_3 for 500 MHz band becomes maximum as shown in FIG. 20. However, the output power of the RF-DC conversion circuit 72_1 for 200 MHz band is not maximum (as indicated by reference numeral 78). In the RF-DC conversion circuits 72_4 and 72_5 for 800 MHz band, the output power is decreased due to the effect of a leak current (as indicated by reference numeral 79). Accordingly, in this case, the power supplied from the RF-DC conversion circuits 72_1 to 72_5 to a single voltage control circuit is about 14 µW.

On the other hand, when the power supply circuits 1 to 3 respectively described in the first to third embodiments are used, for example, the RF-DC conversion circuit 72_1 for 200 MHz band is connected to the voltage control circuit 14_2 (see FIG. 1) and is caused to operate at 0.3 V; the RF-DC conversion circuits 72_2 and 72_3 for 500 MHz band are connected to the voltage control circuit 14_1 and are caused to operate at 0.2 V; and the RF-DC conversion circuits 72_4 and 72_5 for 800 MHz band are disconnected from both the voltage control circuits 14_1 and 14_2, thereby making it possible to recover power of about 20 µW.

The power supply system shown in FIG. 19, in which the antennas 71_1 to 71_5 and the RF-DC conversion circuits 72_1 to 72_5 are provided as voltage sources, has been described above. Alternatively, a thermoelectric element or a solar battery may be provided in the fourth embodiment. The use of a thermoelectric element makes it possible to recover thermal energy. The use of a solar battery makes it possible to recover light energy.

Figure 21:
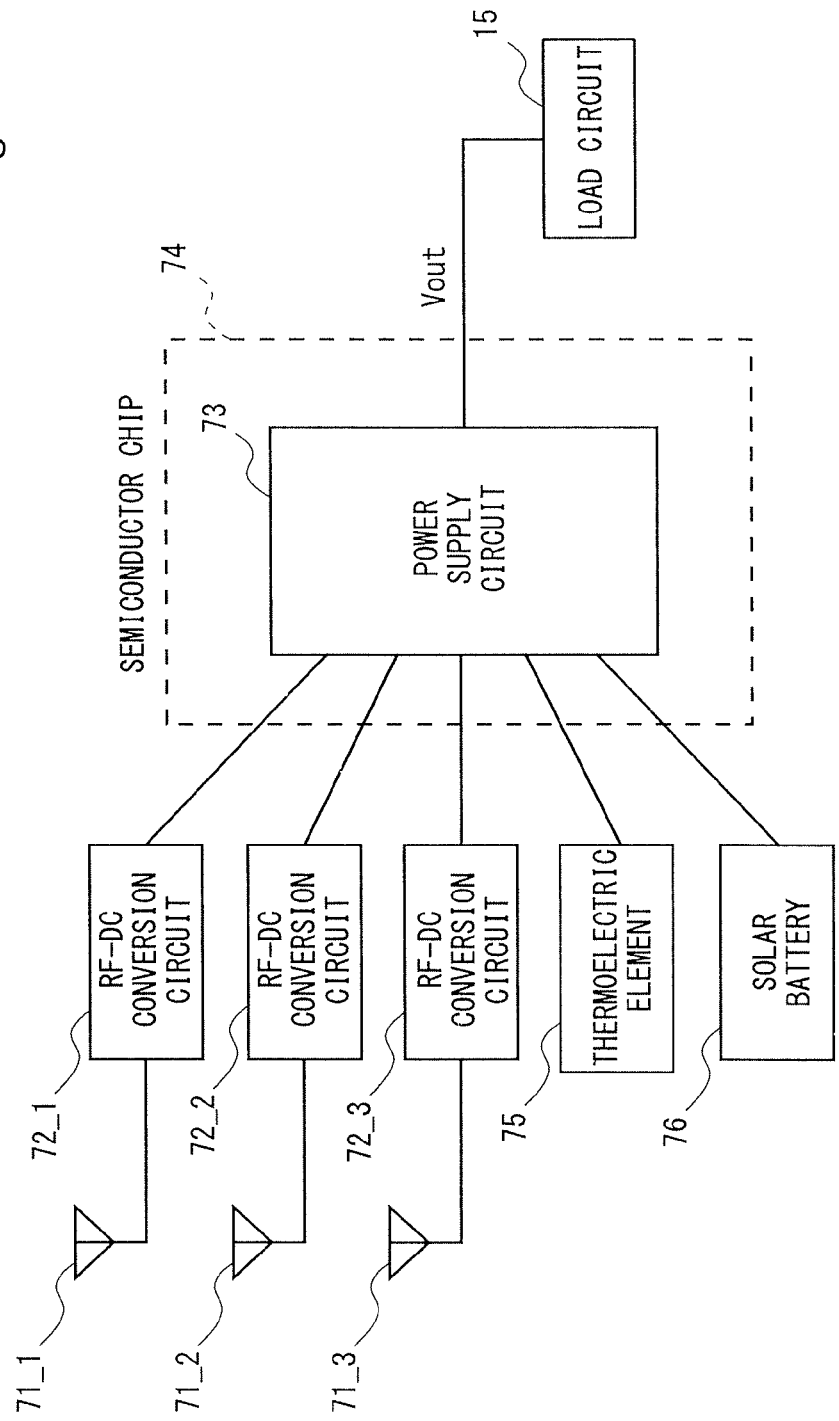
FIG. 21 is a block diagram showing another example of the power supply system according to the fourth embodiment.

As shown in FIG. 21, various types of voltage sources may be used in combination as voltage sources. FIG. 21 illustrates an example in which the antennas 71_1 to 71_3, a thermoelectric element 75, and a solar battery 76 are used in combination as voltage sources. In this manner, the use of various types of voltage sources in combination makes it possible to recover energy (radio energy or thermal energy) from other inputs, even when it is difficult to recover specific energy (light energy) in, for example, a dark place.

When various types of voltage sources are used in combination, the output voltage varies depending on, for example, the intensity of radio energy, thermal energy, or light energy. However, in the fourth embodiment, the plurality of voltage control circuits 14_1 and 14_2 (see FIG. 1) are provided, and the voltage control circuits 14_1 and 14_2 to be connected are switched according to the output voltage obtained by each energy source. Therefore, energy can be effectively recovered from each energy source.

Figure 22:
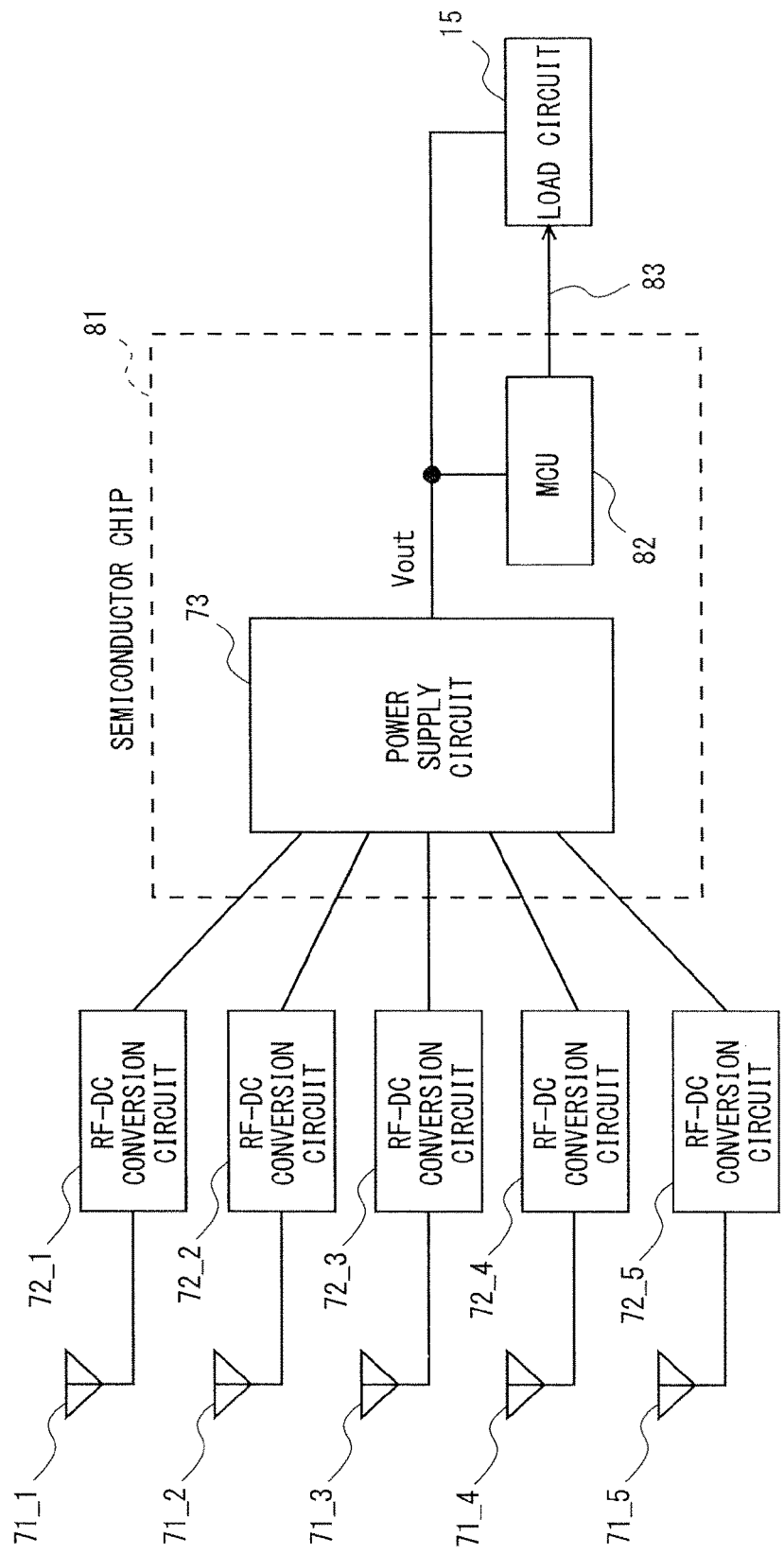
FIG. 22 is a block diagram showing further another example of the power supply system according to the fourth embodiment.

In the fourth embodiment, as shown in FIG. 22, an MCU (Micro Controller Unit) 82 that is driven by the power supply circuit 73 may be mounted on a semiconductor chip 81, and the load circuit 15 may be controlled by a control signal 83 output from the MCU 82. With this configuration, the load circuit 15 can be controlled in more detail. For example, the operation of the load circuit 15 can be interrupted when the output voltage of the power supply circuit 73 is low.

Figure 23:
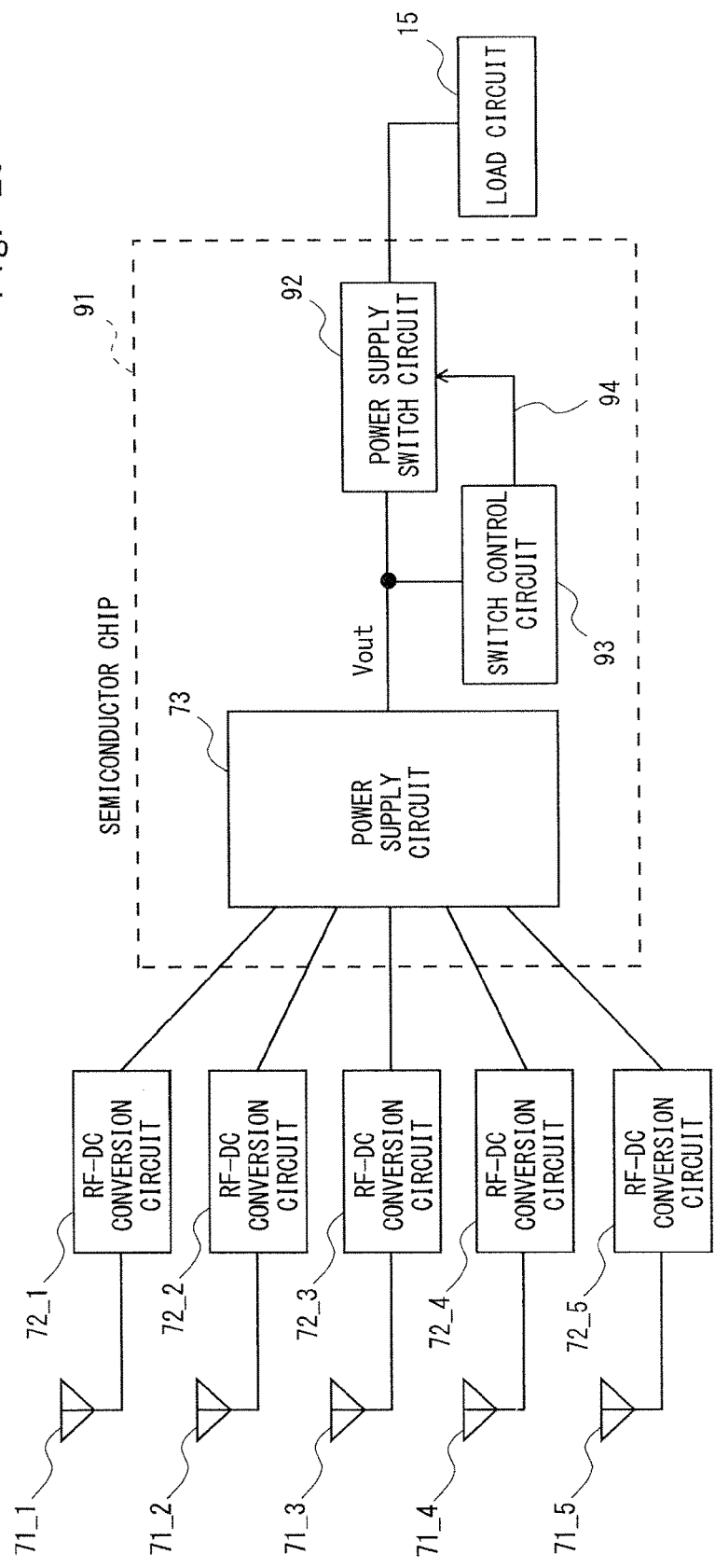
FIG. 23 is a block diagram showing still another example of the power supply system according to the fourth embodiment.

Further, in the fourth embodiment, as shown in FIG. 23, a power supply switch circuit 92, which controls the supply of power to the load circuit 15, and a switch control circuit 93, which controls the power supply switch circuit 92, may be mounted on a semiconductor chip 91. When the output voltage of the power supply circuit 73 is at a certain level or higher (equal to or higher than the operating voltage of the load circuit 15), the switch control circuit 93 outputs a control signal 94 to the power supply switch circuit 92. When the power supply switch circuit 92 is supplied with the control signal 94, the power supply switch circuit 92 connects the power supply circuit 73 and the load circuit 15 to each other, thereby allowing power to be supplied to the load circuit 15.

With this configuration, the supply of power to the load circuit 15 can be started after the output voltage of the power supply circuit 73 reaches a certain level or higher (equal to or higher than the operating voltage of the load circuit 15). Accordingly, the load circuit 15 can be stably started even when the load circuit 15 has a large current consumption and has a voltage equal to or less than an operation guarantee voltage.

While the invention made by the present inventor has been specifically described above with reference to embodiments, the present invention is not limited to the above embodiments, but can be modified in various manners without departing from the scope of the invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:
1. A power supply circuit comprising:
    N (N≥3) voltage sources;
    first and second voltage control circuits that boost respective input voltages; and
    a voltage source connection switch that connects each voltage source to either the first voltage control circuit or the second voltage control circuit based on a voltage of the voltage source,
    wherein
        the first voltage control circuit boosts an input voltage according to a duty ratio of a first clock signal supplied to the first voltage control circuit, and
        the second voltage control circuit boosts an input voltage according to a duty ratio of a second clock signal supplied to the second voltage control circuit.
2. The power supply circuit according to claim 1, wherein the voltage source connection switch connects, to the first voltage control circuit, a voltage source having a voltage lower than a predetermined reference voltage among the N voltage sources, and connects, to the second voltage control circuit, a voltage source having a voltage equal to or higher than the predetermined reference voltage among the N voltage sources.
3. The power supply circuit according to claim 2, further comprising a voltage monitor circuit that monitors a voltage of each of the N voltage sources, wherein
    the voltage monitor circuit includes:
        a reference voltage generation circuit that generates the predetermined reference voltage; and
        a comparator that compares the voltage of each of the N voltage sources with the reference voltage.
4. The power supply circuit according to claim 3, further comprising a voltage source switching circuit that sequentially switches connections between each of the N voltage sources and the voltage monitor circuit.
5. The power supply circuit according to claim 3, wherein
    the power supply circuit has operating modes including a monitor mode and a normal mode,
    in the monitor mode, the voltage monitor circuit monitors the voltage of each of the N voltage sources, and
    in the normal mode, the voltage source connection switch connects at least one of the N voltage sources to one of the first and second voltage control circuits according to a result of monitoring the voltage of each of the voltage sources.
6. The power supply circuit according to claim 1, wherein the first and second voltage control circuits are respectively supplied with the first and second clock signals that are set so that an output voltage of the first voltage control circuit and an output voltage of the second voltage control circuit are substantially the same.
7. The power supply circuit according to claim 6, wherein the first clock signal has a duty ratio larger than that of the second clock signal.
8. The power supply circuit according to claim 1, wherein the first and second clock signals supplied to the first and second voltage control circuits, respectively, are controlled according to a voltage of each of the N voltage sources.
9. The power supply circuit according to claim 1, further comprising a voltage source switch capable of connecting an i ($1 \leq i \leq N-1$)-th voltage source and an (i+1)-th voltage source of the N voltage sources to each other, wherein
    m voltage sources of the N voltage sources are directly connected to the voltage source connection switch, and
    N-m voltage sources of the N voltage sources are connected to the voltage source connection switch via the voltage source switch.
10. The power supply circuit according to claim 9, wherein the voltage source switch connects the i-th voltage source and the (i+1)-th voltage source to each other when a voltage of the i-th voltage source and a voltage of the (i+1)-th voltage source fall within a predetermined range.
11. The power supply circuit according to claim 9, wherein the voltage source switch connects voltage sources each having a voltage lower than a predetermined reference among the N voltage sources to thereby form a first voltage source group, and connects voltage sources each having a voltage equal to or higher than the predetermined reference among the N voltage sources to thereby form a second voltage source group.
12. The power supply circuit according to claim 11, wherein the first voltage source group is connected to the first voltage control circuit, and the second voltage source group is connected to the second voltage control circuit.
13. The power supply circuit according to claim 9, wherein when all voltage source switches between an a-th voltage source and a b-th voltage source ($1 \leq a < b \leq N$) among the N voltage sources are turned on, and when none of the voltage sources directly connected to the voltage source connection switch are included in the voltage sources ranging from the a-th voltage source to the b-th voltage source, voltage source switches between an (a−1)-th voltage source and the a-th voltage source, or voltage source switches between the b-th voltage source and a (b+1)-th voltage source, are turned on.
14. A power supply circuit comprising:
    N (N≥3) voltage sources;
    first and second voltage control circuits that boost respective input voltages; and a voltage source connection switch that connects each voltage source to either the first voltage control circuit or the second voltage control circuit based on a voltage of the voltage source, wherein the first voltage control circuit boosts an input voltage according to a duty ratio of a first clock signal supplied to the first voltage control circuit, the second voltage control circuit boosts an input voltage according to a duty ratio of a second clock signal supplied to the second voltage control circuit, the first and second voltage control circuits and the voltage source connection switch are formed on a chip, the first voltage control circuit and the voltage source connection switch are connected to each other via a first wire formed outside the chip, and the second voltage control circuit and the voltage source connection switch are connected to each other via a second wire formed outside the chip.

15. The power supply circuit according to claim 14, wherein the voltage source connection switch includes:
  a first switch that switches a connection between each of the voltage sources and the first voltage control circuit; and
  a second switch that switches a connection between each of the voltage sources and the second voltage control circuit, and the power supply circuit further comprises:
  a first pad that connects the first wire and one end of the first switch to each other;
  a second pad that connects the second wire and one end of the second switch to each other; and
  a third pad that connects another end of the first switch, another end of the second switch, and the corresponding voltage source to each other, the first pad, the second pad, and the third pad being formed at an end of the chip on a side of the first and second wires.

16. The power supply circuit according to claim 15, wherein one end of the first switch and the first pad are connected to each other by an in-chip wire, and the first wire and the first pad are connected to each other by a bonding wire, one end of the second switch and the second pad are connected to each other by an in-chip wire, and the second wire and the second pad are connected to each other by a bonding wire, and another end of the first switch, another end of the second switch, and the third pad are connected to each other by an in-chip wire, and the third pad and the corresponding voltage source are connected to each other by a bonding wire.

17. A method for controlling a power supply circuit including N ($N \geq 3$) voltage sources and first and second voltage control circuits that boost respective input voltages, the method comprising:

monitoring a voltage of each of the N voltage sources;

connecting each of the N voltage sources to either the first voltage control circuit or the second voltage control circuit based on the voltage of the voltage source;

boosting an input voltage of the first voltage control circuit to obtain a first output voltage from the first voltage control circuit; and boosting an input signal of the second voltage control circuit to obtain a second output voltage from the second voltage control circuit, wherein the first output voltage is substantially the same as the second output voltage.

18. The method for controlling a power supply circuit according to claim 17, further comprising:

connecting, to the first voltage control circuit, a voltage source having a voltage lower than a predetermined reference voltage among the N voltage sources; and connecting, to the second voltage control circuit, a voltage source having a voltage equal to or higher than the predetermined reference voltage among the N voltage sources.

19. The method for controlling a power supply circuit according to claim 18, wherein the voltage of each of the N voltage sources is monitored by comparing the voltage of each of the N voltage sources with the predetermined reference voltage.

* * * * *